(12) United States Patent
Yedidia

(10) Patent No.: US 7,191,376 B2
(45) Date of Patent: Mar. 13, 2007

(54) DECODING REED-SOLOMON CODES AND RELATED CODES REPRESENTED BY GRAPHS

(75) Inventor: Jonathan S. Yedidia, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 504 days.

(21) Appl. No.: 10/728,338

(22) Filed: Dec. 4, 2003

(65) Prior Publication Data

US 2005/0138516 A1 Jun. 23, 2005

(51) Int. Cl.
*H04L 1/18* (2006.01)
(52) U.S. Cl. .................. 714/751; 714/756; 714/784
(58) Field of Classification Search ................ 714/751, 714/748, 756, 784, 786, 752, 758, 703; 341/107, 341/170
See application file for complete search history.

(56) References Cited

U.S. PATENT DOCUMENTS 6,236,762 B1 * 5/2001 Chui et al. .................. 382/250
6,771,197 B1 * 8/2004 Yedidia et al. .............. 341/107
7,000,174 B2 * 2/2006 Mantha et al. .............. 714/790
2003/0065989 A1 * 4/2003 Yedida et al. ............... 714/703
2003/0074626 A1 * 4/2003 Coker et al. ................ 714/752
2003/0079171 A1 * 4/2003 Coe .......................... 714/758

* cited by examiner

Primary Examiner—Albert Decady
Assistant Examiner—Fritz Alphonse
(74) Attorney, Agent, or Firm—Dirk Brinkman; Clifton D. Mueller; Gene V. Vinokur

(57) ABSTRACT

A method decodes a soft-input cost function for an error-correcting code. First, the code is selected and its FSTFG representation is constructed. The representation is simplified, and an encoding method consistent with the representation is selected. A set of message-update and belief-update rules are selected. Messages are initialized according to a soft-input cost function. An iterative decoding cycle is then begun. The first step updates the messages according to the pre-selected message-update rules. The second step determines a trial code word from the messages, the pre-selected message-update rules, and the encoding method. The third step replaces a tentative output code word of the decoding method with the trial code word if the trial code word has lower cost. The decoding cycle terminates if a termination condition is true, and outputs the tentative code word.

22 Claims, 34 Drawing Sheets

| + | 0 | 1 | 2 |
|---|---|---|---|
| 0 | 0 | 1 | 2 |
| 1 | 1 | 2 | 0 |
| 2 | 2 | 0 | 1 |

| * | 0 | 1 | 2 |
|---|---|---|---|
| 0 | 0 | 0 | 0 |
| 1 | 0 | 1 | 2 |
| 2 | 0 | 2 | 1 |

*Fig. 3*
*Prior Art*

| + | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| * | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

*Fig. 4*
*Prior Art*

| + | 0 | 1 | 2 | 3 | 4 |   | * | 0 | 1 | 2 | 3 | 4 |
|---|---|---|---|---|---|---|---|---|---|---|---|---|
| 0 | 0 | 1 | 2 | 3 | 4 |   | 0 | 0 | 0 | 0 | 0 | 0 |
| 1 | 1 | 2 | 3 | 4 | 0 |   | 1 | 0 | 1 | 2 | 3 | 4 |
| 2 | 2 | 3 | 4 | 0 | 1 |   | 2 | 0 | 2 | 4 | 1 | 3 |
| 3 | 3 | 4 | 0 | 1 | 2 |   | 3 | 0 | 3 | 1 | 4 | 2 |
| 4 | 4 | 0 | 1 | 2 | 3 |   | 4 | 0 | 4 | 3 | 2 | 1 |

*Fig. 5*
*Prior Art*

| + | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 0 | 3 | 2 | 5 | 4 | 7 | 6 |
| 2 | 2 | 3 | 0 | 1 | 6 | 7 | 4 | 5 |
| 3 | 3 | 2 | 1 | 0 | 7 | 6 | 5 | 4 |
| 4 | 4 | 5 | 6 | 7 | 0 | 1 | 2 | 3 |
| 5 | 5 | 4 | 7 | 6 | 1 | 0 | 3 | 2 |
| 6 | 6 | 7 | 4 | 5 | 2 | 3 | 0 | 1 |
| 7 | 7 | 6 | 5 | 4 | 3 | 2 | 1 | 0 |

| + | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 3 | 1 | 7 | 5 |
| 3 | 0 | 3 | 6 | 5 | 7 | 4 | 1 | 2 |
| 4 | 0 | 4 | 3 | 7 | 6 | 2 | 5 | 1 |
| 5 | 0 | 5 | 1 | 4 | 2 | 7 | 3 | 6 |
| 6 | 0 | 6 | 7 | 1 | 5 | 3 | 2 | 4 |
| 7 | 0 | 7 | 5 | 2 | 1 | 6 | 4 | 3 |

*Fig. 6*
*Prior Art*

| * | 0 | 1 | 2 | 3 | 4 | 5 | 6 | 7 | 8 |
|---|---|---|---|---|---|---|---|---|---|
| 0 | 0 | 0 | 0 | 0 | 0 | 0 | 0 | 0 | 0 |
| 1 | 0 | 1 | 2 | 3 | 4 | 5 | 6 | 7 | 8 |
| 2 | 0 | 2 | 1 | 6 | 8 | 7 | 3 | 5 | 4 |
| 3 | 0 | 3 | 6 | 4 | 7 | 1 | 8 | 2 | 5 |
| 4 | 0 | 4 | 8 | 7 | 2 | 3 | 5 | 6 | 1 |
| 5 | 0 | 5 | 7 | 1 | 3 | 8 | 2 | 4 | 6 |
| 6 | 0 | 6 | 3 | 8 | 5 | 2 | 4 | 1 | 7 |
| 7 | 0 | 7 | 5 | 2 | 6 | 4 | 1 | 8 | 3 |
| 8 | 0 | 8 | 4 | 5 | 1 | 6 | 7 | 3 | 2 |

| + | 0 | 1 | 2 | 3 | 4 | 5 | 6 | 7 | 8 |
|---|---|---|---|---|---|---|---|---|---|
| 0 | 0 | 1 | 2 | 3 | 4 | 5 | 6 | 7 | 8 |
| 1 | 1 | 2 | 0 | 4 | 5 | 3 | 7 | 8 | 6 |
| 2 | 2 | 0 | 1 | 5 | 3 | 4 | 8 | 6 | 7 |
| 3 | 3 | 4 | 5 | 6 | 7 | 8 | 0 | 1 | 2 |
| 4 | 4 | 5 | 3 | 7 | 8 | 6 | 1 | 2 | 0 |
| 5 | 5 | 3 | 4 | 8 | 6 | 7 | 2 | 0 | 1 |
| 6 | 6 | 7 | 8 | 0 | 1 | 2 | 3 | 4 | 5 |
| 7 | 7 | 8 | 6 | 1 | 2 | 0 | 4 | 5 | 3 |
| 8 | 8 | 6 | 7 | 2 | 0 | 1 | 5 | 3 | 4 |

*Fig. 7*
*Prior Art*

DECODING REED-SOLOMON CODES AND RELATED CODES REPRESENTED BY GRAPHS

FIELD OF THE INVENTION

The present invention relates generally to the field of error-correcting codes for data storage and data transmission, and more particularly to a decoding method for Reed-Solomon and related error-correcting codes.

BACKGROUND OF THE INVENTION

A fundamental problem in the field of data storage and communication is the development of practical decoding methods for error-correcting codes. Chapters 1 through 8 of a textbook by Blahut, "*Algebraic Codes for Data Transmission*," Cambridge University Press: Cambridge, 2003, are an excellent source for background information about error-correcting codes. The class of Reed-Solomon codes is one of the most important classes of error-correcting codes, and very widely used in practice, see chapters 6 and 7, ibid. Prior-art decoding methods for Reed-Solomon codes are known to be far from optimal.

Error-Correcting Codes

Any references to "codes" herein specifically mean linear block error-correcting codes. The basic idea behind these codes is to encode a string of k symbols using a string of N symbols, where N>k. The additional N–k bits are used to correct corrupted messages.

The string of N symbols is also sometimes called a "block" or a "word." A block of N symbols that satisfies all the constraints of the code is called a "code word." The symbols are assumed to be drawn from a q-ary alphabet. An important special case is when q=2. In that case, the code is called a "binary" code.

FIG. 1 shows a conventional scenario for which a linear block error-correcting code is used, which is often called "channel coding." A source 101 produces a string s[a] containing k symbols 102, where the symbols are drawn from a q-ary alphabet. The string is passed to an encoder 10 of the error-correcting code, and is transformed into a code word x[n] containing N symbols 103.

The code word 103 is then transmitted through a channel 115, where the code word is corrupted into a signal y[n] 104. The corrupted signal y[n] 104 is then passed to a decoder 120, which outputs a reconstruction 105 z[n] of the code word x[n].

Parameters of Codes

A linear code is defined by a set of $q^k$ possible code words having a block length N. The parameter k is sometimes called the "dimension" of the code. Codes are normally much more effective when N and k are large. However, as the size of the parameters N and k increases, so does the difficulty of decoding corrupted messages.

The Hamming distance between two code words is defined as the number of symbols that differ in the two words. The distance d of a code is defined as the minimum Hamming distance between all pairs of code words in the code. Codes with a larger value of d have a greater error-correcting capability. Codes with parameters N, k, and q are referred to, as is well known in the art, as $[N, k]_q$ codes. If the distance d is also known, then they are referred to as $[N, k, d]_q$ codes.

Galois Fields

Linear codes are usually defined in terms of a set of constraints on the q-ary symbols that make up a code word.

In order to characterize these constraints, it is useful to define an arithmetic for q-ary symbols. The theory of finite fields, which are also called Galois fields, provides a way to define addition and multiplication over q-ary symbols, see chapter 4, ibid.

In a Galois field, when any two symbols from a q-ary alphabet are added or multiplied together, the result is an element in the same alphabet. There is a multiplicative and additive identity element, and each element has a multiplicative and additive inverse, except that the additive identity element has no multiplicative inverse. The commutative, associative, and distributive laws hold for Galois fields.

Galois fields are denoted GF(q), where q is the number of elements in the alphabet. A Galois field can be specified in terms of its addition and multiplication tables. The simplest Galois field is GF(2), which has two elements 0 and 1, where 0 is the additive identity and 1 is the multiplicative identity.

As shown in FIG. 2, the addition rules for GF(2) are 0+0=1+1=0, and 0+1=1+0=1, and the multiplication rules for GF(2) are 0*0=0*1=1*0=0, and 1*1=1.

As shown in FIG. 3, GF(3) has three elements 0, 1, and 2, where 0 is the additive identity, 1 is the multiplicative identity, and the addition rules are 0+0=1+2=2+1=0, 0+1=1+0=2+2=1, 0+2=1+1=2+0=2, and the multiplication rules are 0*0=0*1=0*2=1*0=2*0=0; 1*1=2*2=1, 1*2=2*1=2.

Galois fields can be defined for any q that is a prime number or an integer power of a prime number. The addition and multiplication rules for any Galois field can be easily derived, see for example chapter 4, ibid.

These rules can be represented using addition and multiplication tables similar to those learned by school children for ordinary arithmetic. FIGS. 4–7 provide respectively the addition and multiplication tables for the Galois fields GF(4), GF(5), GF(8), and GF(9).

The operations of division and subtraction are also defined for Galois fields, and can be derived by adding negatives and multiplying inverses. The negative of x is the number that when added to x gives zero. The inverse of x is the number that gives one when multiplied by x. All sums and multiplications of q-ary symbols described herein use the rules of GF(q).

A primitive element of a Galois field is defined to be an element a such that every element of the Galois field except for the zero$^{th}$ element can be expressed as a power of α. For example, in the field GF(5), one has $2^1=2$, $2^2=4$, $2^3=3$, $2^{4=1}$, so 2 is a primitive element of GF(5).

Generator Matrix Representations of Codes

A block code is "linear" when the sum of any two code words is also a code word. The sum of two code words of N symbols each is defined to be the word of N symbols, obtained by summing the individual symbols, one at a time. For example the sum of the two code words 1110100 and 0111010 using GF(2) is 1001110.

A generator matrix can compactly represent a linear code. In fact, many different generator matrices can represent the same linear code.

A generator matrix representing an $[N, k]_q$ code is a matrix of L rows and N columns, where each element in the matrix is a q-ary symbol. The N columns of the matrix correspond to the N symbols in a code word. The generator matrix contains k linearly independent rows. If L>k, then some of the rows of the generator matrix are redundant. All the code words in a code can be obtained by taking linear combinations of the rows of a generator matrix.

An illustrative example of a generator matrix is the following matrix for an [N=4, k=2, d=3]$_{q=3}$ code known as the "tetra-code":

$$G = \begin{pmatrix} 1 & 0 & 1 & 1 \\ 0 & 1 & 1 & 2 \end{pmatrix}. \quad (1)$$

The tetra-code has block-length N=4, and the number of code words is $q^k=9$.

As an example, the tetra-code code word 1202 is obtained by summing the first row of the generator matrix with two times the second row, because 1202=1011+2*(0122) using GF(3). In all, the nine code words of the tetra-code are 0000, 1011, 2022, 0112, 1120, 2101, 0221, 1201, and 2210.

As another example, the following is a generator matrix of the [N=7, k=4, d=3]$_{q=2}$ binary Hamming code:

$$G = \begin{pmatrix} 1 & 0 & 1 & 1 & 0 & 0 & 0 \\ 0 & 1 & 0 & 1 & 1 & 0 & 0 \\ 0 & 0 & 1 & 0 & 1 & 1 & 0 \\ 0 & 0 & 0 & 1 & 0 & 1 & 1 \end{pmatrix}. \quad (2)$$

Encoders for Error-Correcting Codes

The encoder 110 for the linear [N, k]$_q$ code transforms the string of k symbols 102 into the code word of N symbols 103. The string of k symbols that is thus transformed into $q^k$ different code words is referred to as an "information block," and the symbols in the information block are referred to as "information symbols." Encoders can be constructed using the generator matrix for the code.

More specifically, suppose one has an information block s[a], and one desires to construct an N symbol code word x[n] for the code generated by the generator matrix G. Encoding can be done using the equation $$x[n] = \sum_{a=1}^{k} G[a,n]s[a], \quad (3)$$

where G[a,n] is the value of the symbol in the matrix G in the $a^{th}$ row and $n^{th}$ column.

For example, consider the tetra-code, as represented by the generator matrix given in equation (3). If the information block is 12, then the corresponding code word is 1*1011+2*0112=1011+0221=1202, using the rules of addition and multiplication for GF(3).

Parity Check Matrix Representations of Codes

Parity check matrices can also represent linear codes. The parity check matrix representing the [N, k]$_q$ code is a matrix of q-ary symbols, with M rows and N columns. The N columns of the parity check matrix correspond to the N symbols of the code. The number of linearly independent rows in the matrix is k.

Each row of the parity check matrix represents a constraint. The symbols involved in the constraint represented by a particular row correspond to the columns that have a non-zero symbol in that row. The parity check constraint forces the weighted sum, over GF(q), of those symbols to be equal to zero. For example, for a binary code, the parity check matrix $$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix} \quad (4)$$

represents the three constraints $$x[1]+x[2]+x[3]+x[5]=0 \quad (5)$$

$$x[2]+x[3]+x[4]+x[6]=0 \quad (6)$$

$$x[3]+x[4]+x[5]+x[7]=0, \quad (7)$$

where x[n] is the value of the $n^{th}$ bit. This parity check matrix is another way to represent the [N=7, k=4, d=3]$_{q=2}$ Hamming code represented by the generator matrix given in equation (2).

For the tetra-code, the generator matrix also happens to be a parity check matrix of the same code. Codes for which this is true are called self-dual codes. Thus, for the tetra-code, $$H = \begin{pmatrix} 1 & 0 & 1 & 1 \\ 0 & 1 & 1 & 2 \end{pmatrix}, \quad (8)$$

which represents the two constraints $$x[1]+x[3]+x[4]=0 \quad (9)$$

$$x[2]+x[3]+2x[4]=0. \quad (10)$$

It is easy to verify that all the code words of the tetra-code satisfy these constraints.

Reed-Solomon Codes

Reed-Solomon codes are a very well-known and popular class of codes that have optimal distance properties. A Reed-Solomon code can be defined for any set of parameters N, k, and q, such that GF(q) is a finite field and N=q−1. The [N,k]$_q$ Reed-Solomon code has a distance d=N−k+1, which has been proven to be the maximum distance possible for any [N,k]$_q$ code.

A standard way to obtain the [N,k,d]$_q$ Reed-Solomon code is to construct a generator matrix G, that has k rows and N columns, according to the following prescription. One first chooses a primitive element α of GF(q). The element in the $j^{th}$ row and $k^{th}$ column of G is given the value $\alpha^{(j-1)(k-1)}$.

For example, a [N=4,k=3,d=2]$_{q=5}$ Reed-Solomon code would have the following generator matrix, assuming that one chose α=2 as the primitive element:

$$G = \begin{pmatrix} 1 & 1 & 1 & 1 \\ 1 & 2 & 4 & 3 \\ 1 & 4 & 3 & 2 \end{pmatrix}. \quad (11)$$

Notice that when the above specification of a generator matrix is combined with equation (3), it implies that a Reed-Solomon code word x[n] can be obtained from an information block s[a] according to the formula $$x[n] = \sum_{a=1}^{k} \alpha^{(a-1)(n-1)} s[a]. \quad (12)$$

This formula has the form as a discrete Fourier transform over a Galois field, where N−k input variables have been set to zero. In the discrete Fourier transform over the Galois field, the primitive element α plays the role that an exponential term normally plays in a discrete Fourier transform over complex numbers, as it is a root of unity. This relationship between Reed-Solomon codes and discrete Fourier transforms is known, and is emphasized in chapters 6 and 7, ibid.

A useful property of Reed-Solomon codes is that they are "cyclic" codes. This means that when one cyclically shifts a code word, one obtains another code word. For example, cyclically shifting the code word 1243 of the above $[N=4, k=3, d=2]_{q=5}$ Reed-Solomon code gives the code word 2431.

Extended Reed-Solomon Codes

Standard Reed-Solomon codes have a block-length N that is related to the parameter q by the equation $N=q-1$. Closely related codes for which $N=q$, called "extended Reed-Solomon codes," can be obtained by appending a single symbol to a Reed-Solomon code. The distance d of an extended Reed-Solomon code is still given by $d=N-k+1$, and is still the optimal possible distance. To obtain the generator matrix of an extended Reed-Solomon code, one simply adds a single column to the generator matrix of the Reed-Solomon code. That column has a 1 in the first row, and 0's in every other row. For example, the generator matrix of the $[N=5, k=3, d=3]_{q=5}$ extended Reed-Solomon code is $$G = \begin{pmatrix} 1 & 1 & 1 & 1 & 1 \\ 0 & 1 & 2 & 4 & 3 \\ 0 & 1 & 4 & 3 & 2 \end{pmatrix} \quad (13)$$

Punctured Reed-Solomon Codes

Instead of appending symbols from a Reed-Solomon code, one can also obtain new codes by removing, or "puncturing" symbols. A punctured Reed-Solomon code has a block-length N that is less than $q-1$. The distance d of the punctured Reed-Solomon code is still given by $d=N-k+1$, and is still the optimal possible distance. To obtain the generator matrix of the punctured Reed-Solomon code, one removes columns from the generator matrix of the Reed-Solomon code.

Performance Criteria for Error-Correcting Codes

The decoder 120 for a linear $[N, k]_q$ code accepts as input a received and perhaps corrupted version y[n] 104 of a transmitted code word x[n] 103, and outputs the reconstruction z[n] 105. The performance of the decoder is measured in terms of failure rates. The failure rates measure how often the reconstruction z[n] fails to match the originally transmitted code word x[n]. The decoding failure rate depends on the amount of noise that the channel introduces: the higher the level of noise, the higher the decoder failure rate.

Optimal decoders output the most likely code word z[n], given the received signal y[n]. An optimal decoder is therefore often called a "maximum likelihood" decoder. Even an optimal decoder van sometimes fail, when the noise from the channel has made the originally transmitted code word x[n] less likely than some other code word.

Hard-Input Decoders for Error-Correcting Codes

A class of decoders, referred to as "hard-input decoders," accepts inputs such that the corrupted version of the transmitted code word is an N-symbol word y[n], whose symbols take values from the same q-ary alphabet as the error-correcting code.

Such decoders are useful when the channel corrupts q-ary symbols in the code word to other q-ary symbols with some small probability. Making the standard assumption that all transmitted code words are a priori equally likely, an optimal hard-input decoder for such channels outputs the code word z[n] that has the smallest distance from y[n].

An example of a hard input for a tetra-code decoder would be the word 2122. This word is not a code word of the tetra-code, and the code word that has the smallest distance from this word is 2022, so an optimal hard-input decoder would output 2022 when the decoder received the input 2122.

Soft-Input Decoders for Error-Correcting Codes

Alternatively, a corrupted signal can first be transformed into a "cost function," C, and then that cost function is input to the decoder. The cost function is a q×N matrix specifying a cost for each possible state of each code word symbol.

Decoders that accept such cost functions as their input are referred to as "soft-input" decoders. For the tetra-code, which has $N=4$ and $q=3$, an example cost function for the soft-input decoder is $$C = \begin{pmatrix} 0.1 & 0.2 & 0.1 & 0.1 \\ 1.0 & 0.0 & 2.5 & 1.5 \\ 0.0 & 2.0 & 0.0 & 0.0 \end{pmatrix}. \quad (14)$$

This cost function means that the cost of assigning the first symbol the value '0' is 0.1; the cost of assigning the first symbol the value '1' is 1.0; the cost of assigning the first symbol the value '2' is 0.0; the cost of assigning the second symbol the value '0' is 0.2; and so on.

An optimal soft-input decoder returns a code word z[n] that has a lowest possible summed cost, given the cost function. For example the code word of the tetra-code that has the lowest cost, given the cost function above, is 0000, which has a cost of $0.1+0.2+0.1+0.1=0.5$.

The cost in the soft-input decoder is often taken to be equal to the negative of the log-likelihood for each bit, given the received signal and the channel model. As mentioned before, optimal decoders are often called "maximum likelihood" decoders, which makes sense because minimizing the cost corresponds to maximizing the likelihood.

Soft input cost functions arise in many cases of practical interest. For example, in many practical communication applications, the q symbols of a q-ary code are transmitted by "modulating" the symbols into q different electromagnetic waveforms. When a waveform is received after passing through the channel, it is compared to the possible transmitted waveforms, and depending on how similar the waveform is to each of the possible transmitted waveforms, a cost is assigned to each of the q possible symbols.

Constructing optimal hard-input or soft-input decoders for error-correcting codes is a problem that becomes intractably complicated for codes with large N and k. For this reason, most decoders used in practice are not optimal.

Non-optimal hard-input decoders attempt to determine the closest code word to the received word, but are not guaranteed to do so, while non-optimal soft-input decoders attempt to determine the code word with the lowest cost, but are not guaranteed to do so.

Bounded Distance Decoders

Most prior-art decoders for Reed-Solomon codes are non-optimal hard-input decoders known as "bounded distance decoders." The bounded-distance decoder decodes any received hard-input word to a nearest code word, so long as the input word has a Hamming distance to the nearest code word that is less than or equal to the bounded distance decoding radius t, where $t=\lfloor(d-1)/2\rfloor$. Here, the floor function $\lfloor x \rfloor$ indicates that the fractional part of x is subtracted.

There can be at most one code word within distance t or less of a word. Therefore, the bounded-distance decoder optimally decodes the input word to the transmitted code word whenever the channel changes t or fewer code word symbols. Conversely, the bounded-distance decoder fails to decode when the received word has a distance from any code word that is greater than the decoding radius t. If the channel changes t or more code word symbols, then the bounded-distance decoder fails to correctly decode the transmitted code word.

A variety of prior art bounded distance decoding methods have been developed for Reed-Solomon codes, see chapters 6–8, ibid. These decoding methods all depend ultimately on solving systems of algebraic equations over GF(q), and are therefore usually called "algebraic" decoding methods.

The error-correcting performance of a bounded-distance decoder is normally much worse than the performance of the optimal hard-input decoder. Some progress has been made recently in developing so-called "list decoders," which are hard-input algebraic decoders that perform somewhat better than older bounded-distance decoders, though still not as well as optimal decoders, see V. Guruswami and M. Sudan, "*Improved Decoding of Reed-Solomon and Algebraic-Geometric Codes*," IEEE Transactions on Information Theory, vol. 45, pp. 1757–1767, September 1999.

Using Hard-Input Decoders with Soft Inputs

When a soft-input cost function is given, but only a hard-input decoder is available, the hard-input decoder can nevertheless be used as a decoder by first thresholding the cost function to obtain a hard input. To threshold a cost function, one determines the lowest cost value for each symbol separately.

For example, given the cost function of equation (14) above, the lowest cost value for the first symbol is 2, the lowest cost value for the second symbol is 1, the lowest cost value for the third symbol is 2, and the lowest cost value for the fourth symbol is 2. Thus, by thresholding, one converts the soft-input cost function into the hard-input word 2122. An optimal hard-input decoder then decodes to the code word 2022.

Note that even if the hard-input decoder is optimal, the thresholding procedure will cause the decoding procedure for a soft-input cost function to become non-optimal. As mentioned already, for the example soft input given above, the optimal code word of the tetra-code was 0000, but thresholding followed by optimal hard-input decoding gave the non-optimal code word 2122.

It is known that the performance penalty caused by using thresholding and hard-input decoding is quite severe.

Therefore, it would be of great benefit to develop soft-input decoders for Reed-Solomon codes, rather than using the prior art method of thresholding, followed by hard-input decoding.

One such effort in this direction is the algebraic decoding method of R. Koetter and A. Vardy, which builds on the list-decoding method developed by Guruswami and Sudan. See R. Koetter and A. Vardy "*Algebraic Soft-Decision Decoding of Reed-Solomon Codes*," IEEE Transactions on Information Theory, vol. 49, pp. 2809–2825, November 2003. Although the Koetter and Vardy's decoding method is of considerable interest, simulation results show that it only gives relatively small performance gains compared to simple thresholding followed by bounded-distance decoding, and is far from optimal soft-input decoding.

Turbo-Codes and Low-Density Parity Check Codes

Since 1993, when the outstanding performance of new soft-input decoding methods for a class of codes called "turbo-codes" was described, there has been a great deal of interest in approximate soft-input decoding methods based on iterative "message-passing" methods. These message-passing decoding methods are often called "belief propagation" decoding methods. Such a decoding method was actually first described in 1963 by R. Gallager to decode low-density parity check (LDPC) codes.

The success of turbo-codes rekindled an interest in LDPC codes and in soft-input message-passing decoding methods. There has been a considerable amount of recent work whose goal is to improve the performance of both turbo-codes and LDPC codes. For example a special issue of the IEEE Communications Magazine was devoted to this work in August 2003. For an overview, see C. Berrou, "*The Ten-Year-Old Turbo Codes are entering into Service*," IEEE Communications Magazine, vol. 41, pp. 110–117, August 2003 and T. Richardson and R. Urbanke, "*The Renaissance of Gallager's Low-Density Parity Check Codes*," IEEE Communications Magazine, vol. 41, pp. 126–131, August 2003.

Unlike Reed-Solomon codes, which are constructed using a regular construction, turbo-codes and LDPC codes are constructed using a random construction. For example, a binary LDPC code is defined in terms of its parity check matrix, which consists only of 0's and 1's, where a small number of 1's are placed randomly within the matrix.

At relatively low signal-to-noise ratios, i.e., when the corruption caused by the channel is relatively large, LDPC codes and turbo-codes can often outperform Reed-Solomon codes that are decoded using bounded-distance decoders.

On the other hand, because of their random construction, LDPC codes and turbo-codes are difficult to analyze theoretically, and it is very difficult to give any guarantees about their performance comparable to the guarantees that one obtains using bounded distance decoders for Reed-Solomon codes. LDPC codes and turbo-codes also suffer from the phenomena of "error-floors." When a decoding method has an "error-floor," that means that at as the signal-to-noise ratio becomes large i.e., as the corruption caused by the channel becomes small, the decoding failure rate becomes smaller, but only very slowly.

Error-floors are a serious problem for LDPC codes and turbo-codes, which means that for high signal-to-noise ratios, or for very low target decoding failure rates, Reed-Solomon codes and other regular codes with good distance properties and bounded distance decoders are often still preferred.

Codes Defined on Graphs

Message-passing decoding methods are best understood when the error-correcting codes that they decode are represented as graphs. Such graphs, now often called "factor graphs," were first described in 1981 by R. M. Tanner, see R. M. Tanner "*A Recursive Approach to Low Complexity Codes*," IEEE Transactions on Information Theory, vol. 27, pp. 533–547, September 1981, and F. R. Kschischang, B. J. Frey, and H.-A. Loeliger, "*Factor Graphs and the Sum-Product Algorithm*," IEEE Transactions on Information Theory, vol. 47, pp. 498–519, February 2001. There are several essentially equivalent forms of factor graphs.

The following discussion is based on so-called "normal" factor graphs, as described by G. D. Forney, Jr., in "*Codes* on *Graphs: Normal Realizations,*" IEEE Transactions on Information Theory, vol. 47, pp. 520–548, February 2001.

As shown in FIG. 8, a normal factor graph can be used to represent both the "hard" constraints that the symbols in a code word must satisfy, as well as the "soft" cost function that is input to a soft-input decoder.

A normal factor graph is drawn as a collection of connected vertices. The connections between the vertices, which are drawn as lines 800, represent "variables." Some of the variables may be symbols that make up a code word of the code, some may be information symbols, and some may be other, so-called "auxiliary" variables that help to define the code.

Each variable can be in one of a number of different possible states. In all the factor graphs considered herein, each variable can be in q different states. The state of the $i^{th}$ variable is denoted $x[i]$.

The vertices, which are drawn as squares and referred to as "factor nodes," represent constraints placed on the variables that connect to that factor node. In a "normal" factor graph, each variable can be connected to either one or two factor nodes, and each factor node is connecteds to one or more variables.

The rule that no variable can be connected to more than two factor nodes may initially appear to be restrictive, but it is not, because a variable can be "copied" by connecting it to an equality constraint, and the copy can then be connected to additional factor nodes.

A marking is placed within the square representing each factor node to indicate what type of constraint it represents. For example, an "=" marking 801 is placed inside a square representing a factor node that constrains the connected variables to be equal.

Associated with each possible configuration of the variables connected to a factor node is a "cost." The cost can be infinite. For "hard" constraints, which must be absolutely obeyed, some of the costs are in fact infinite. For example, for an equality constraint, one would define the cost for any configuration where the connected variable nodes were equal to be zero, and any configuration where the connected variable nodes were not equal to be infinite.

"Soft" constraints are also easy to represent in a factor graph, simply by using factor nodes that do not have any infinite costs. In the example factor graphs described here, soft constraints 802 are marked by factor nodes, which have a 'C' inside the square. The 'C' marking is used because it is the first letter of the words "cost" and "channel." The soft constraints in a factor graph representing a code are obtained from the soft-input cost function coming from the channel.

The cost associated with the $a^{th}$ factor node is denoted $C_a$. It is a function only of the states of the variables connected to the $a^{th}$ factor node, which is denoted as $\{x[i]\}_{i \in N(a)}$, or more succinctly as $x_a$.

The total cost C of an overall configuration of variables in a normal factor graph is simply the sum of the costs of each factor:

$$C = \sum_a C_a(x_a). \quad (15)$$

In the factor graph in FIG. 8, there are three variables 800, and one factor 801 that constrains them all to be equal. A second, soft, constraint 802, is attached to one of the variables.

A factor graph by itself does not give all the information needed to determine the cost. In particular, one also needs to know the number of possible states of each variable, and the exact form of all the cost functions for the factor nodes.

Suppose, for the sake of example, that q=2 for the code represented by the factor graph shown in FIG. 8, and that the soft cost function is attached to the first variable node and gives a cost of 0 if that variable is a '0', and 0.5 if that variable is a '1'. In that case, the configurations that give non-infinite cost are 000, which has a cost of 0, and 111, which has a cost of 0.5. This factor graph thus represents the binary code, which has a generator matrix $$G=(1\ 1\ 1), \quad (16)$$

and has a soft input cost function $$C = \begin{pmatrix} 0 & 0 & 0 \\ 0.5 & 0 & 0 \end{pmatrix}. \quad (17)$$

In general, to represent both a code and also the cost function that is input to a soft-input decoder, a factor graph must has factor nodes that represent the hard constraints defining the codes, as well as a soft constraint attached to each variable that is a code word symbol.

Often in the prior art, a slightly different, but completely equivalent interpretation of factor graphs is used. In that interpretation, the costs $C_a(x_a)$ are replaced by functions $f_a(x_a)$ defined by $f_a(x_a)=\exp(C_a(x_a))$. The factor graph can then be interpreted as generating an overall probability density function over the configurations given by $$p = \frac{1}{Z} \prod_a f_a(x_a), \quad (18)$$

where Z is a normalization constant introduced to ensure that the sum of the probabilities of all the configurations is one.

Factor Graphs for LDPC Codes

As described above, factor graphs are very often used to represent LDPC codes. Recall that LDPC codes are defined in terms of their parity check matrices. Given a parity check matrix, it is a possible to construct a corresponding normal factor graph for the code.

As an example of how this can be done, consider the parity check matrix for the $[N=7, k=4, d=3]_{q=2}$ Hamming code:

$$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix}.$$

As shown in the corresponding normal factor graph in FIG. 9, this code has seven code word variables 900, and three parity checks. Notice that there are seven soft constraint nodes 903, and three hard parity constraint factor nodes 901, marked by a '+'.

Each parity factor node is connected to the variables involved in that parity check. There are also seven hard equality constraint nodes 902, which are used to copy the variables representing the code word symbols $x[n]$. The equality constraints are necessary because of the rule that no variable is attached to more than two constraints in a normal factor graph.

Message-Passing on Factor Graphs

Message-passing decoding methods are closely related to factor graphs. There are a variety of known methods and they share some common features. For background, see F. R. Kschischang, B. J. Frey, and H.-A. Loeliger, "*Factor Graphs and the Sum-Product Algorithm*," IEEE Transactions on Information Theory, vol. 47, pp. 498–519, February 2001. There are also decoding methods based on "generalized belief propagation," see J. S. Yedidia, W. T. Freeman, and Y. Weiss, "*Constructing Free Energy Approximations and Generalized Belief Propagation Algorithms*," Mitsubishi Electric Research Laboratories, TR2002-35, August 2002.

In those methods, "messages" are sent from one factor node to another factor node, along the connections between the factor nodes. Recall that a connection between factor nodes represents a variable. A message is a vector of q numbers, corresponding to the q possible states of the variable along which it passes. The message represents the cost of the q possible states of the variable, given what the factor node that is sending the message knows from the other messages that it is receiving.

For example, if an equality constraint that connected three variables received messages from two of them that the cost of a '0' was much lower than the cost of a '1', the constraint sends out a message to the third variable that it should be in the '0' state; that is that the cost of a '0' for that variable should also be much less than a '1'.

A "belief" that a variable is in one of its possible states can then be determined from the messages arriving at that variable. The "belief" is normally represented as a q-ary vector. The vector contains estimated costs, or equivalently probabilities, that each of the q possible values of a variable node is the correct one. The decoder ultimately selects the state of each symbol by picking the symbol value whose belief has a highest probability or lowest cost.

In detail, different message-passing methods use different rules to update the messages, but the basic idea of these methods is always the same. One begins with some initial, unbiased messages, and then starts to update them according to the message update rules.

At each iteration, one can determine the state of each variable by the messages that it receives. After an ending criterion, such as a fixed number of iterations having passed, is achieved, the decoding method is stopped, and the state of each variable is determined for the last time. The lowest cost code word encountered during the decoding procedure is output by the decoder.

The Importance of Sparse Graphs

As already mentioned, given a parity check matrix for a code, a factor graph for the same code can be straightforwardly constructed. However, it has been observed empirically that message-passing decoding methods only work well on graphs that are sparse. A sparse normal factor graph is one that only has a small number of variables connected to each factor.

An intuitive explanation for the fact that sparse graphs are necessary is that if many messages are input into all the factor nodes, then it is likely that one or more message into each factor node will send incorrect information, which causes incorrect information to be sent out of every factor node. In a sparse normal graph, on the other hand, a few factor nodes may send out some incorrect messages, but enough factor nodes will send out correct messages so that the system can eventually settle into a low cost configuration.

The factor graphs that correspond to the parity check matrices of LDPC codes are inherently sparse because of the low-density property of the parity check matrices of LDPC codes.

Other linear codes can also sometimes be represented by sparse generator factor graph representations. For example, Reed-Muller codes and other codes based on finite geometries can be represented by sparse factor graphs, see G. D. Forney, Jr., "*Codes on Graphs: Normal Realizations*," IEEE Transactions on Information Theory, vol. 47, pp. 520–549, February 2001; and J. S. Yedidia, J. Chen, and M. Fossorier, "*Representing Codes for Belief Propagation Decoding*," Proceedings of the International Symposium on Information Theory, p. 176, 2003. Codes based on finite geometries, including Reed-Muller codes, are of some interest, but are used very much less in practice than Reed-Solomon codes because they have much worse distance properties.

The representation of Reed-Muller codes and other codes based on finite geometries used by Yedidia, et al. was a redundant representation. In a redundant representation, extra factor nodes are added, which are not necessary to define the code, because their constraints are already implied by constraints of other factor nodes in the graph. Redundant representations can sometimes by useful in improving the decoding performance of message-passing decoding methods.

Some short block length rate ½ binary codes with excellent distance properties, including the binary extended Golay code, also have known sparse factor graph representations, see J.-C. Carlach and A. Otmani, "*A Systematic Construction of Self-Dual Codes*," IEEE Transactions on Information Theory, vol. 49, pp. 3005–3009, November 2003.

Until now, no sparse factor graph representation of Reed-Solomon codes is known. There has been no obvious way to construct such a representation, because the parity check matrices of Reed-Solomon codes are completely dense, i.e., every code word symbol is involved in every single constraint.

The lack of an appropriate sparse factor graph representation of Reed-Solomon codes has until now prevented the use of message-passing decoding methods to decode Reed-Solomon codes.

Therefore, there is a need for a sparse factor graph representation for Reed-Solomon codes so that message-passing methods can be used to decode Reed-Solomon codes.

SUMMARY OF THE INVENTION

The present invention provides a soft-input message-passing decoding method for Reed-Solomon codes, extended or punctured Reed-Solomon codes, and other related codes. The decoding method represents these codes as a sparse transform factor graph, specifically a fast sparse transform factor graph. The soft-input message-passing decoding method can be used to decode any code that can be represented using a fast sparse transform factor graph.

The decoding method accepts a soft-input cost function, and outputs a code word that has a low cost. The present invention also provides a method for encoding codes represented by fast sparse transform factor graphs.

During initialization, the following elements are selected.

An $[N,k,d]_q$ code is selected. The code has a fast sparse transform factor graph (FSTFG) representation. Therefore, the selected code is referred to as a FSTFG code.

A specific FSTFG representation of the code is constructed. Many different FSTFG representations are usually possible for the same FSTFG code. In the preferred embodiment, the FSTFG representation is simplified. It is also advantageous to construct an FSTFG representation that is redundant, if the improved performance is more important than the additional decoding complexity.

An encoding method is selected for the FSTFG code. The encoding method is consistent with the selected FSTFG representation.

A soft-input decoding method for the FSTFG code is selected. The preferred decoder uses a message-passing decoding method based on a set of message-update rules and belief-update rules. However, other decoding methods are also possible.

Then, the decoder is ready to begin accepting soft-input cost functions, and outputting low-cost code words. For the purposes of this invention, the soft-input cost functions are N×q matrices containing real numbers, or an infinity symbol.

The decoder is initialized by reading in a set of initial messages that are determined from the soft-input cost function.

Then, the decoder begins an iterated decoding cycle.

In the first step of the decoding cycle, the messages are updated based on the selected message update rules.

In the second step of the decoding cycle, a "trial" code word is determined using the updated messages into variables in the FSTFG that correspond to information symbols, and the encoding method. The cost of that code word is also determined.

In the third step of the decoding cycle, the trial code word becomes a tentative output of the decoder if it is lower in cost than any previous trial code word.

In the fourth step of the decoding cycle, a check is made for a termination condition. In the preferred embodiment of the invention, the termination condition is a fixed number of decoding cycles.

If the termination condition not satisfied, then the cycle is repeated until the termination condition is satisfied.

Otherwise, the decoder outputs the tentative code word as the code word that has a lowest cost.

The decoder can be combined with any other decoder that outputs code words. The costs of the code words outputted by the decoders are compared, and the combined decoder outputs the lowest cost code word.

The decoder can also be concatenated with another soft-input decoder. When this strategy is used, the beliefs computed using the decoder are used as an improved cost function that is the input for some other soft-input decoder.

BRIEF DESCRIPTION OF THE TABLES AND DRAWINGS

Figure 2:
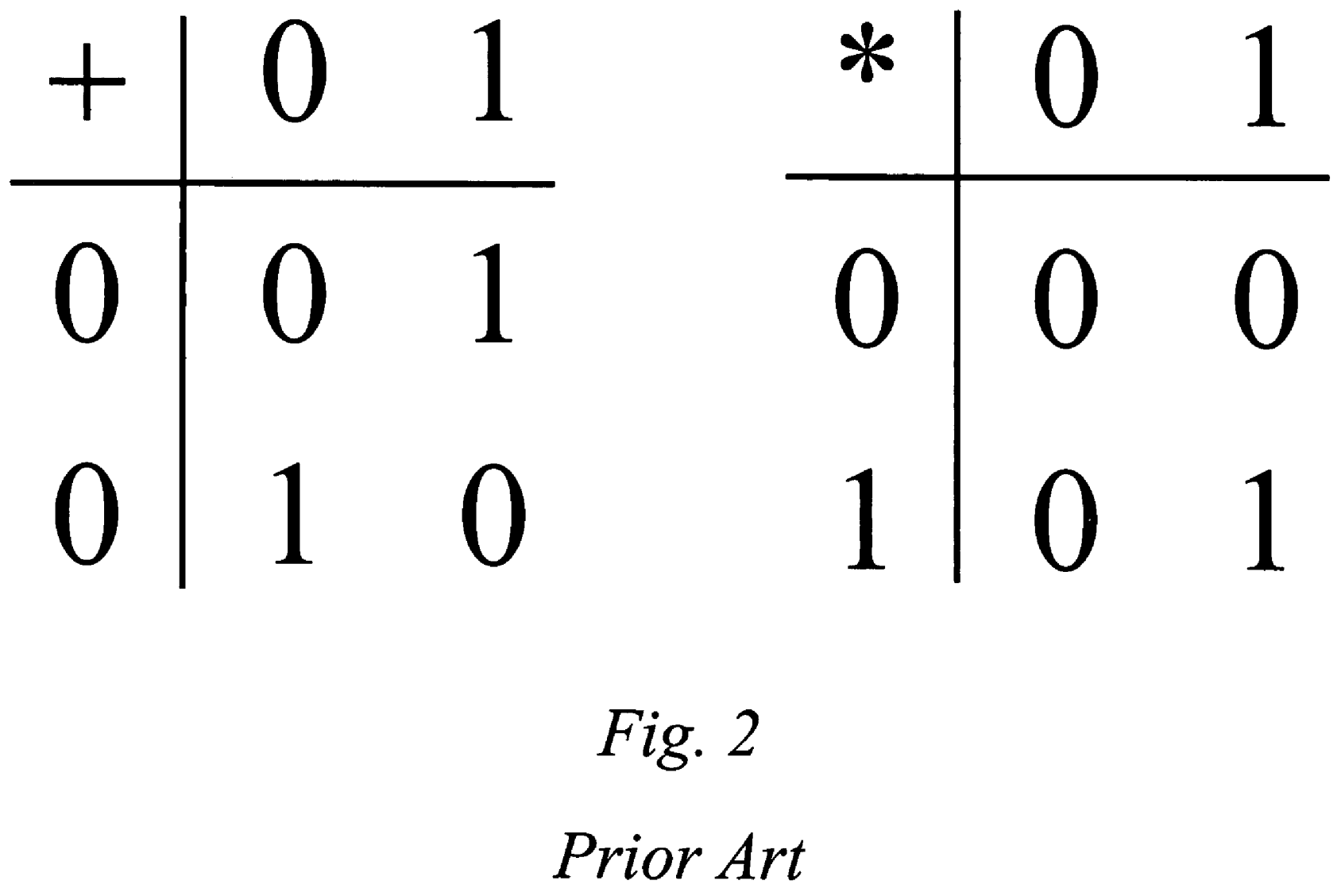

FIG. 2 is an addition table and a multiplication table for Galois fields;

Figure 3:
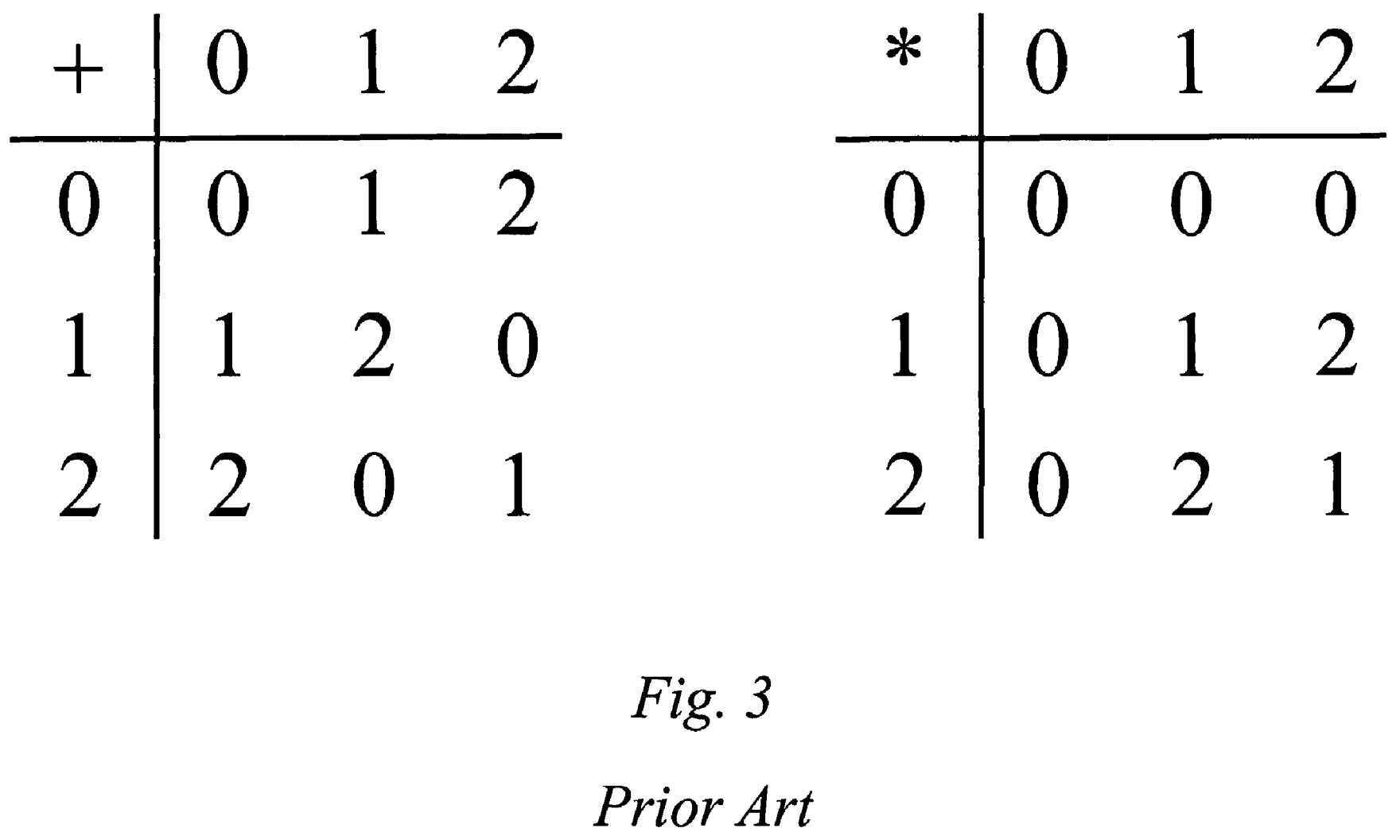

FIG. 3 is an addition table and a multiplication table for Galois fields;

FIG. 4 is an addition table and a multiplication table for Galois fields;

FIG. 5 is an addition table and a multiplication table for Galois fields;

FIG. 6 is an addition table and a multiplication table for Galois fields;

FIG. 7 is an addition table and a multiplication table for Galois fields;

DETAILED DESCRIPTION OF THE PREFERRED EMBODIMENT

Figure 1:
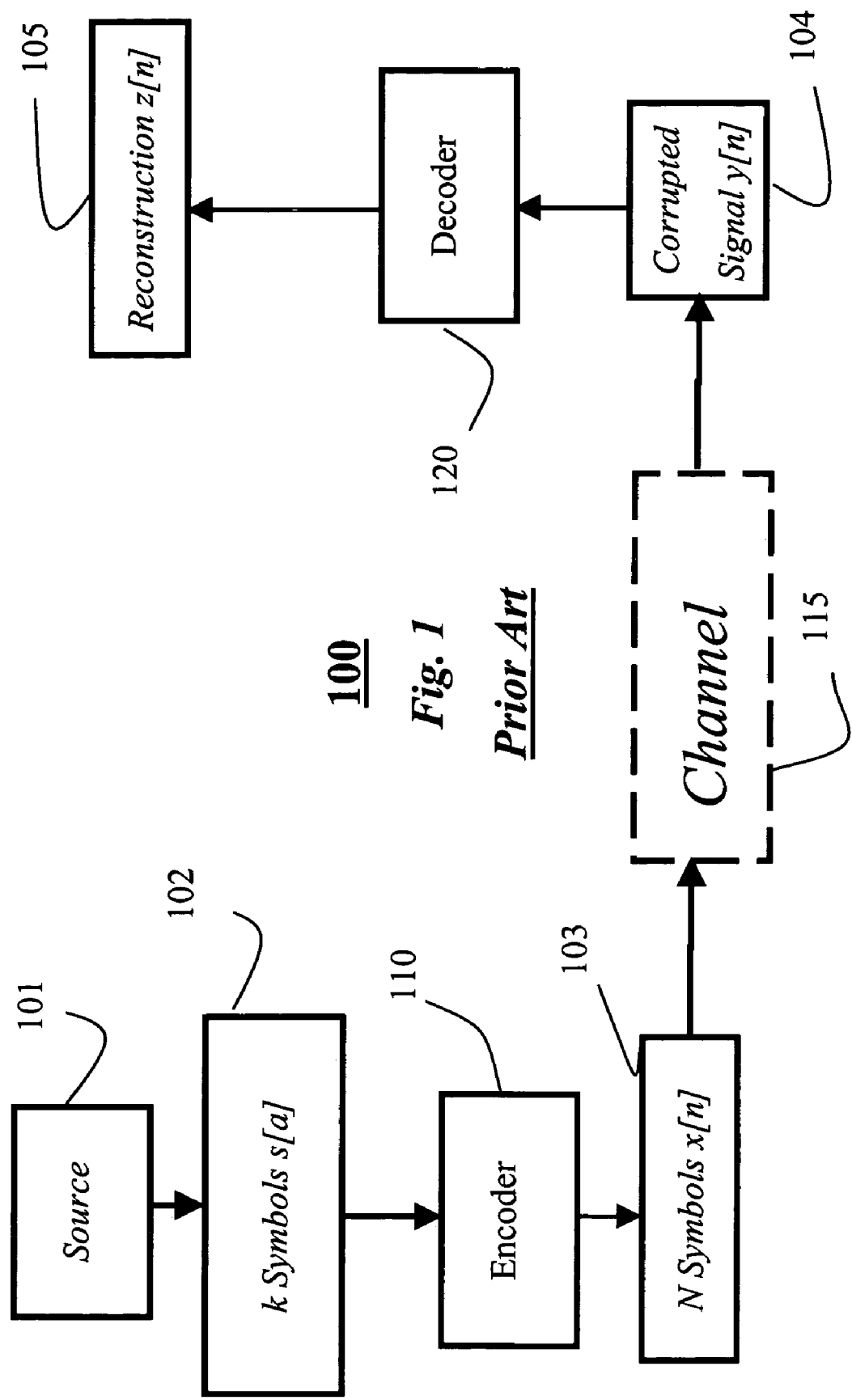
FIG. 1 is a block diagram of a prior art channel coding method.
Figure 8:
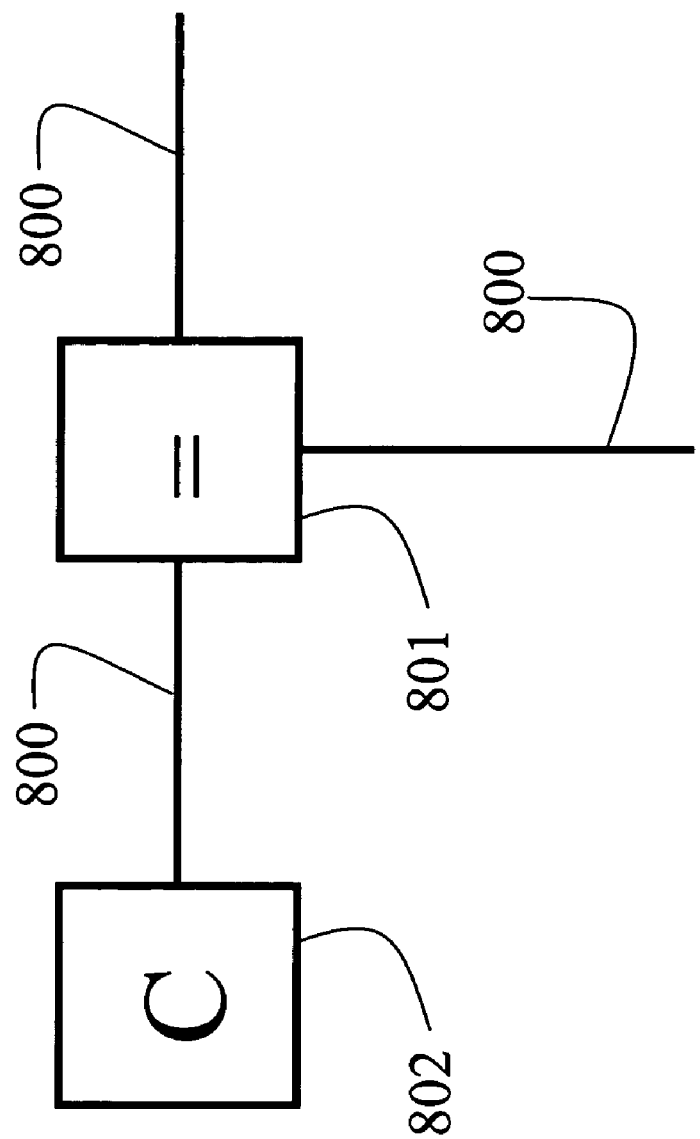
FIG. 8 is a small normal factor graph.
Figure 9:
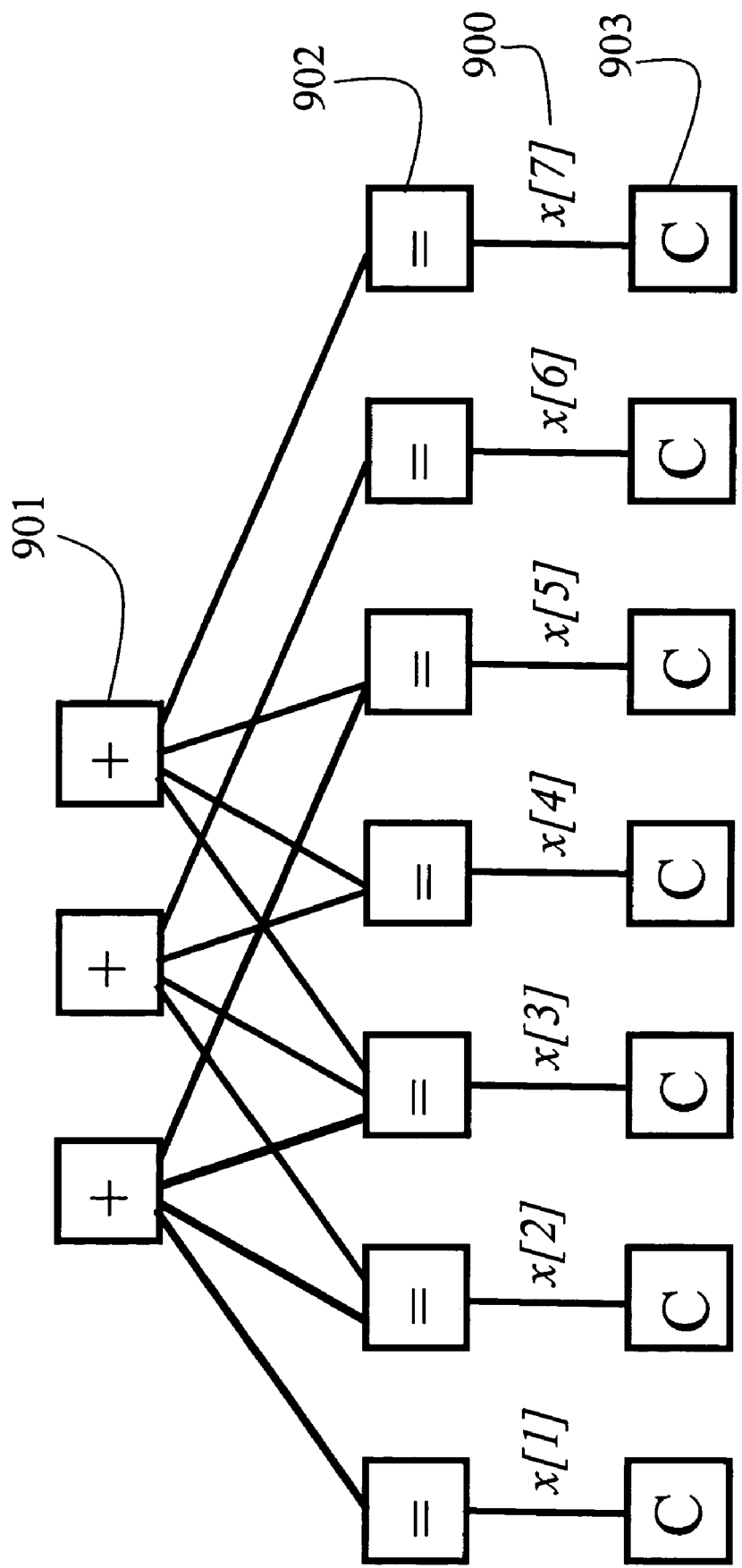
FIG. 9 is a normal factor graph for a Hamming code.
Figure 10:
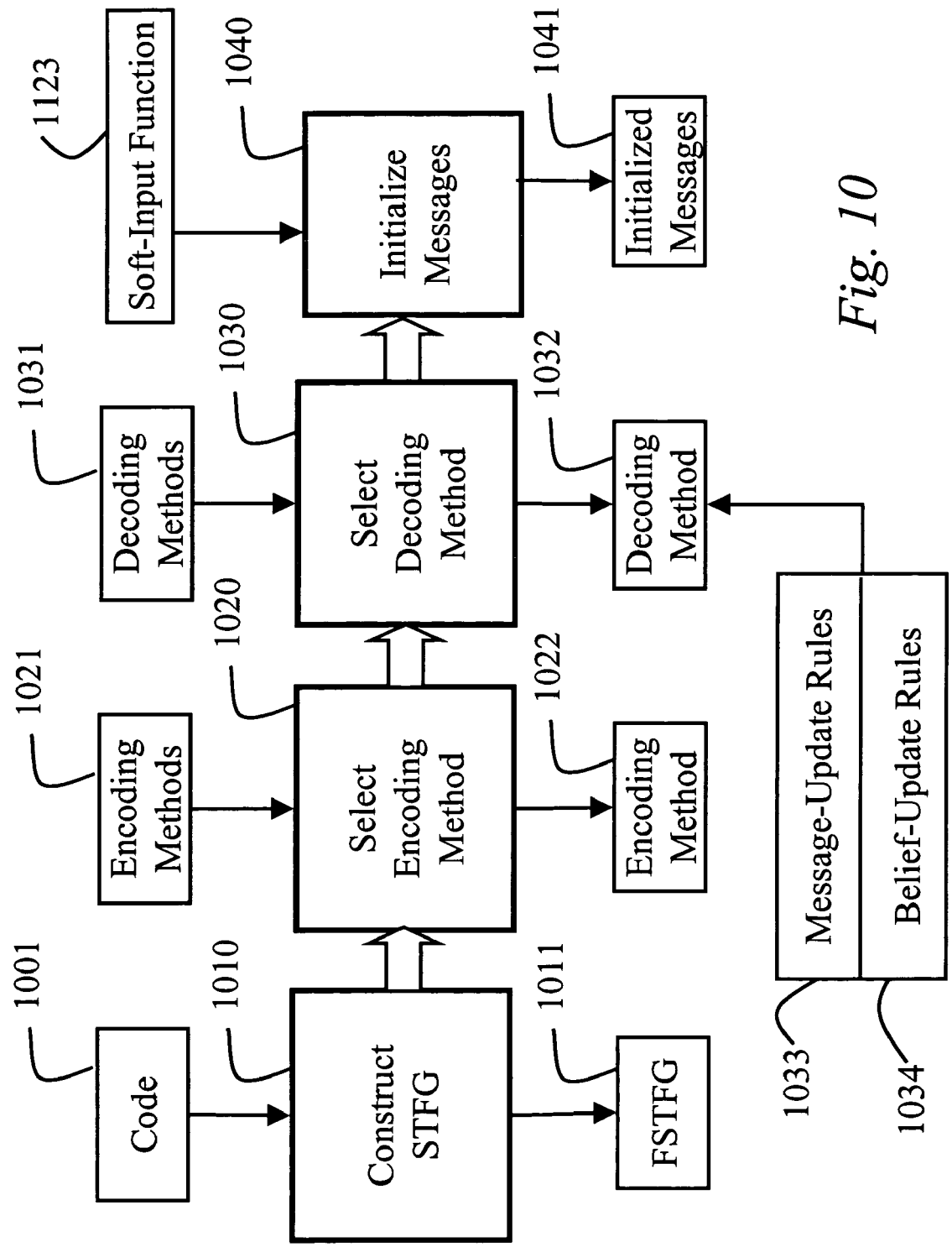
FIG. 10 is a flow diagram of an initialization procedure according to the invention.
Figure 11:
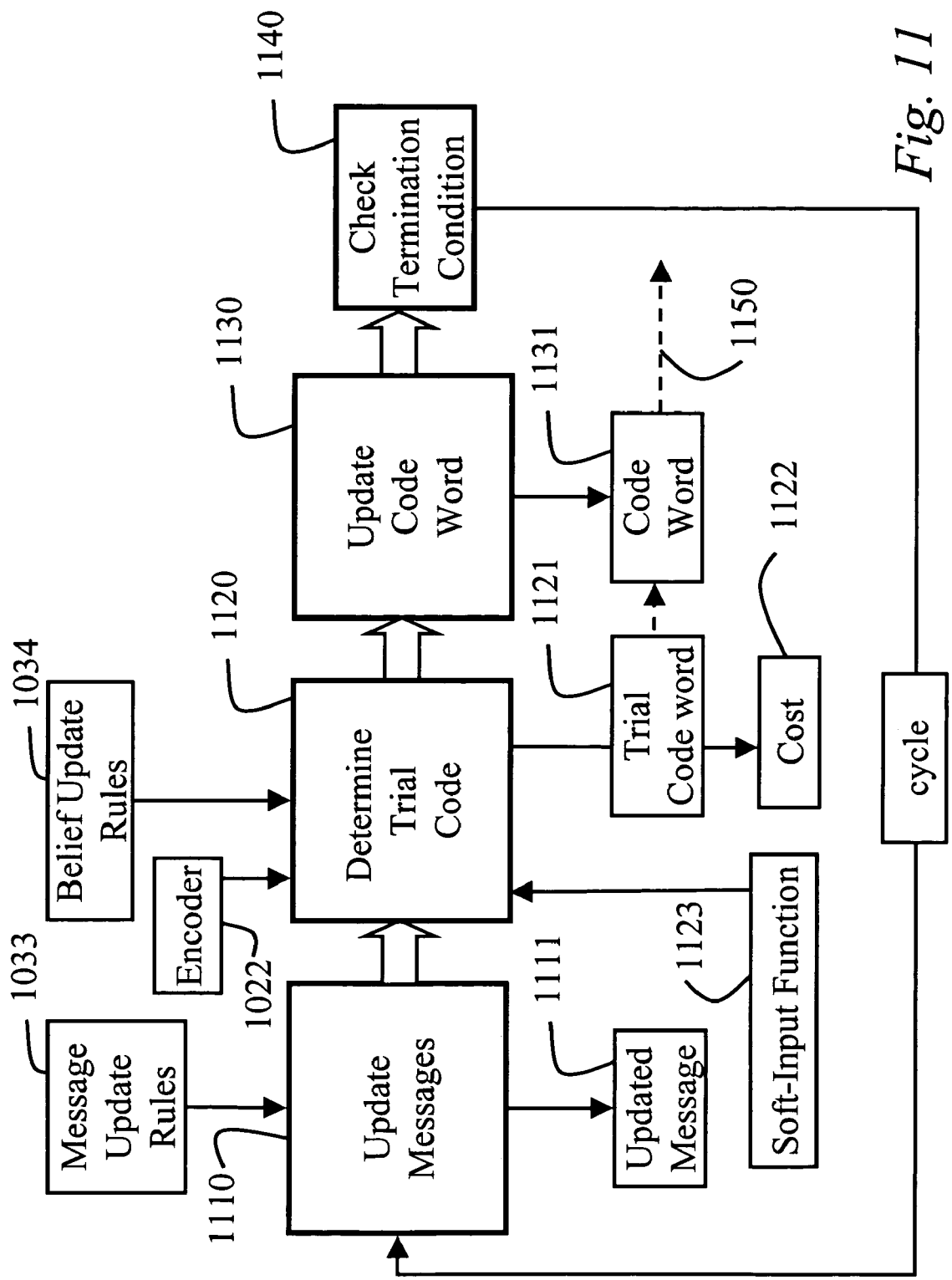
FIG. 11 is a flow diagram of an iterative decoding procedure according to the invention.

FIGS. 10 and 11 show a method for decoding a Reed-Solomon code or related code according to my invention.

FIG. 10 shows a one-time initialization procedure, and FIG. 11 shows the steps of an iterative decoding procedure.

Construct Graph for Selected Code

To begin, I construct 1010 a fast sparse transform factor graph (FSTFG) 1011 for a code 1001. The code can be a Reed-Solomon code, extended Reed-Solomon code, punctured Reed-Solomon code, or other FSTFG codes. A fast sparse transform factor graph is describe in detail below.

In the preferred embodiment, I use the well known $[N,k,d]_q$ Reed-Solomon code such that the block length N is a power of two, or an extended Reed-Solomon code such that the block length is a power of two, or a punctured Reed-Solomon code based on a Reed-Solomon code that has a block length that is a power of two, or some other FSTFG code that has a block length that is a power of two. I call this preference the "power of two" preference. Reed-Solomon codes that are used in practice often obey the "power of two" preference.

As an example, I use the $[N=8, k=6, d=3]_{q=9}$ Reed-Solomon code. Of course, codes that are used in practice are often much larger. For example, Reed-Solomon codes with a block length of around 64 or 256 are often used in practice. My method applies to codes of these block lengths as well.

A conventional way to obtain the $[N,k,d]_q$ Reed-Solomon code is to construct a generator matrix G that has k rows and N columns, according to the following prescription.

One first selects a primitive element α of GF(q). The element in the $j^{th}$ row and $k^{th}$ column of G is given the value $\alpha^{(j-1)(k-1)}$. If this prescription is used for the $[N=8,k=6, d=5]_{q=9}$ Reed-Solomon code, using the tables for GF(9) given in FIG. 7, and selecting α=3 as the primitive element, then the following generator matrix is obtained:

$$G = \begin{pmatrix} 1 & 1 & 1 & 1 & 1 & 1 & 1 & 1 \\ 1 & 3 & 4 & 7 & 2 & 6 & 8 & 5 \\ 1 & 4 & 2 & 8 & 1 & 4 & 2 & 8 \\ 1 & 7 & 8 & 3 & 2 & 5 & 4 & 6 \\ 1 & 2 & 1 & 2 & 1 & 2 & 1 & 2 \\ 1 & 6 & 4 & 5 & 2 & 3 & 8 & 7 \end{pmatrix}. \quad (19)$$

Input-Output Factor Nodes

I now define in detail what is meant by FSTFG codes. A basic building block for the factor graphs representing these codes is an input-output factor node.

The input-output factor node has a fixed small number k of "input" variables entering the node from the left, and the same fixed small number of "output" variables exiting the node from the right. The "rank" of the input-output factor node is k.

In FSTFG representations of codes that obey the "power of two" preference, exactly two variables enter every input-output factor node from the left and two variables exit the node from the right, so the rank is two.

A Reed-Solomon code that has a block-length that is a power of k that is different from 2 similarly uses input-output factor nodes that have the rank k. The FSTFG representation of a Reed-Solomon code that has a block length that factorizes in some more complicated way uses a mixture of input-output factor nodes corresponding to that factorization.

For example, the FSTFG representation of a Reed-Solomon code of block length 10 uses input-output factor nodes that have rank 5 and rank 2, because 10 factorizes into 5 times 2. In the following, I focus on the preferred case, when all the input-output factor nodes have rank k=2.

In the input-output factor node of rank k, there are k constraints on the 2k variables. The k constraints are given by k equations that relate the output variables to the input variables.

Assuming that k=2, the two input variables are x[1] and x[2], and the two output variables are y[1] and y[2]. These two constraints are $$y[1]=Ax[1]+Bx[2], \text{ and} \quad (20)$$

$$y[2]=Cx[1]+Dx[2], \quad (21)$$

where A, B, C, and D are constants chosen from GF(q). The choice of the four, or more generally $k^2$, constants in these equations defines the specific form of a input-output factor node.

An input-output factor node is drawn as a square with the constraint equations placed inside, and with the input variables represented by connected lines coming into the square from the left, and the output variables represented by connected lines coming out of the square to the right. To save some space, I write $x_1$ instead of x[1]. Furthermore, instead of writing the full equations inside the square, an input-output factor node can also be depicted by placing just the $k^2$ constants inside the square. I prefer to use this more abbreviated form.

Figure 12:
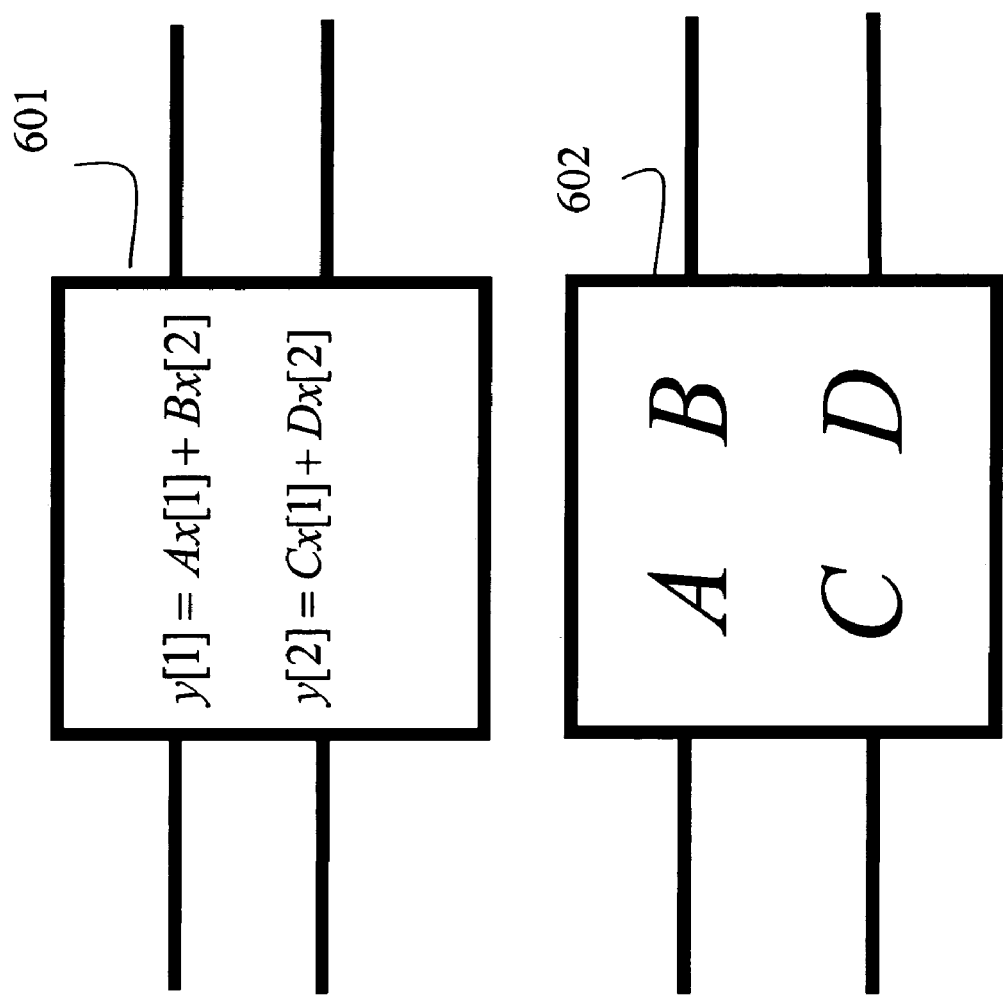
FIG. 12 is an input-output factor node, drawn in two different styles.

FIG. 12 shows a prototypical rank two input-output factor node, drawn in a "full" 601 and an "abbreviated" style 602.

Fast Sparse Transform Factor Graphs

A function y=f(x) takes an input number x and outputs another number y related to x by y=f(x). A transform is similar to a function except that the function takes a set of M numbers as an input and outputs another set of M numbers. The input-output factor nodes are an example of a transform, where M equals the rank of the input-output factor node.

Input-output factor nodes are used to build larger transforms. I use only input-output factor nodes that have a small rank k, preferably k=2. I use small rank input-output factor nodes because k should be small to construct a sparse factor graph. Recall that only if a factor graph is sparse can one expect a message-passing decoding method to work well on the graph.

To build larger transforms out of small rank input-output factor nodes, the input-output factor nodes are stacked and layered.

Figure 13:
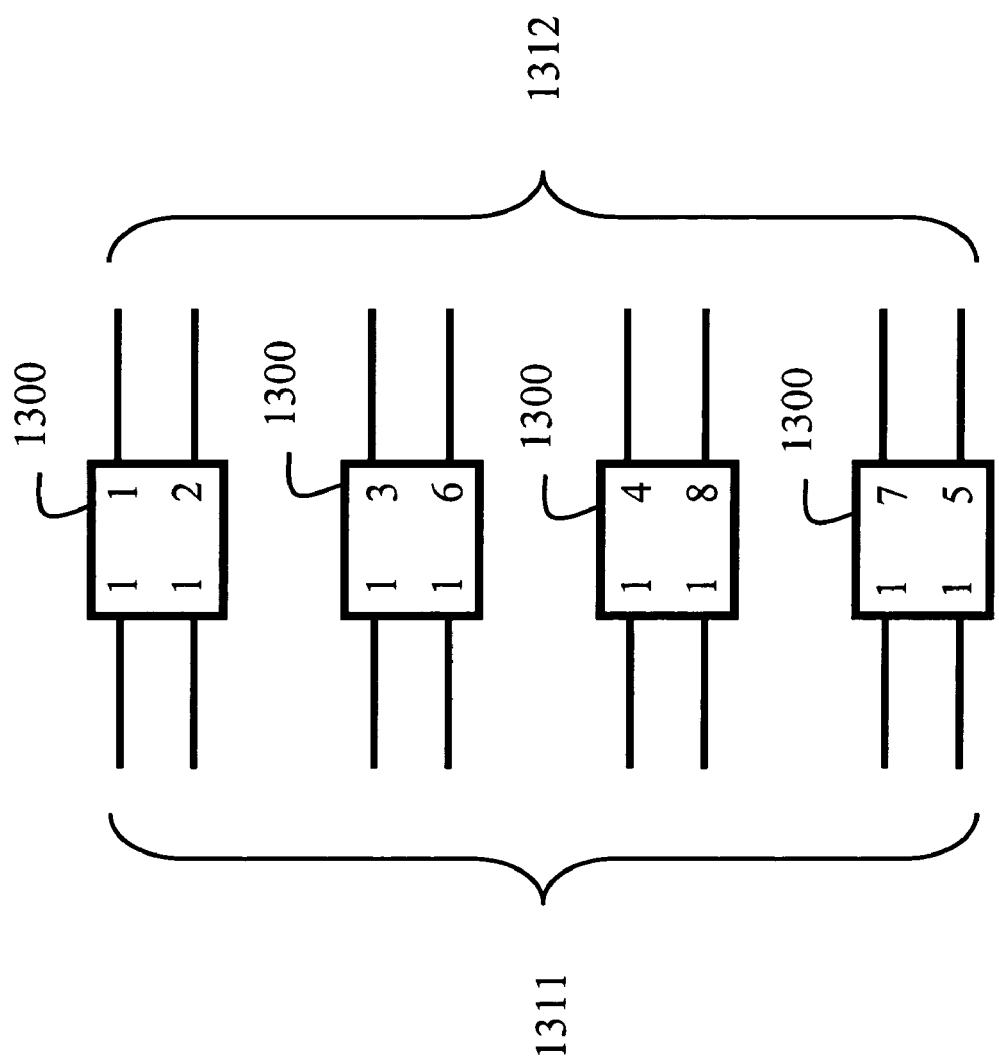
FIG. 13 is a factor graph containing four stacked input-output factor nodes.

As shown in FIG. 13, to stack L input-output factor nodes 1300, one simply places the nodes on top of each other. A stack of L input-output factor nodes of rank k is a transform with M=Lk input and output variables. In FIG. 13, I have stacked four rank 2 input-output factor nodes 1300, creating a transform that takes 8 input variables 1311, and outputs 8 variables 1312. For the purposes of this example, the constants inside the input-output factor nodes are arbitrary.

To layer two transforms, I take the output of the first transform, and use that as the input of the second transform. The outputs of the first transform are possibly permuted before being input to the second transform. To layer more transforms, I simply repeat the process. I also possibly permute the inputs to the first layer and the outputs of the last layer. If each layer is a transform with M input and output variables, then the transform constructed out of the layers also has M input and output variables.

Figure 14:
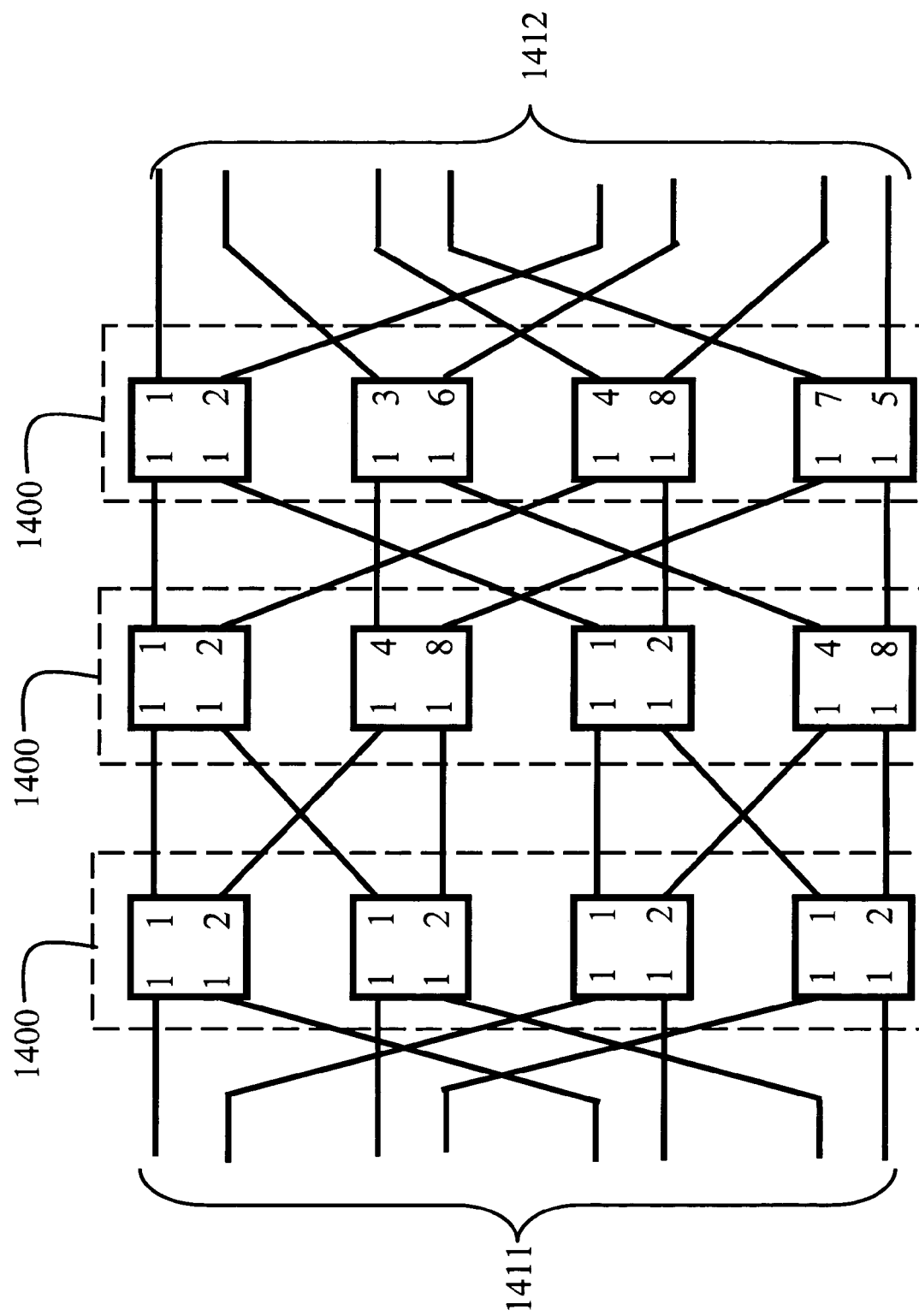
FIG. 14 is a transform factor graph containing three layers of four stacked input-output factor nodes.

FIG. 14 shows a transform constructed out of three layers 1400 of transforms, where each layer is a stack of four input-output factor nodes as shown in FIG. 13. This particular transform is the basis of the factor graph representing the Reed-Solomon code as used by my invention.

The variables, as indicated by lines, at the left end of the graph are "input" variables 1411, the variables at the right end of the graph are "output" variables 1412, and the variables that are between layers are "internal" variables.

Figure 15:
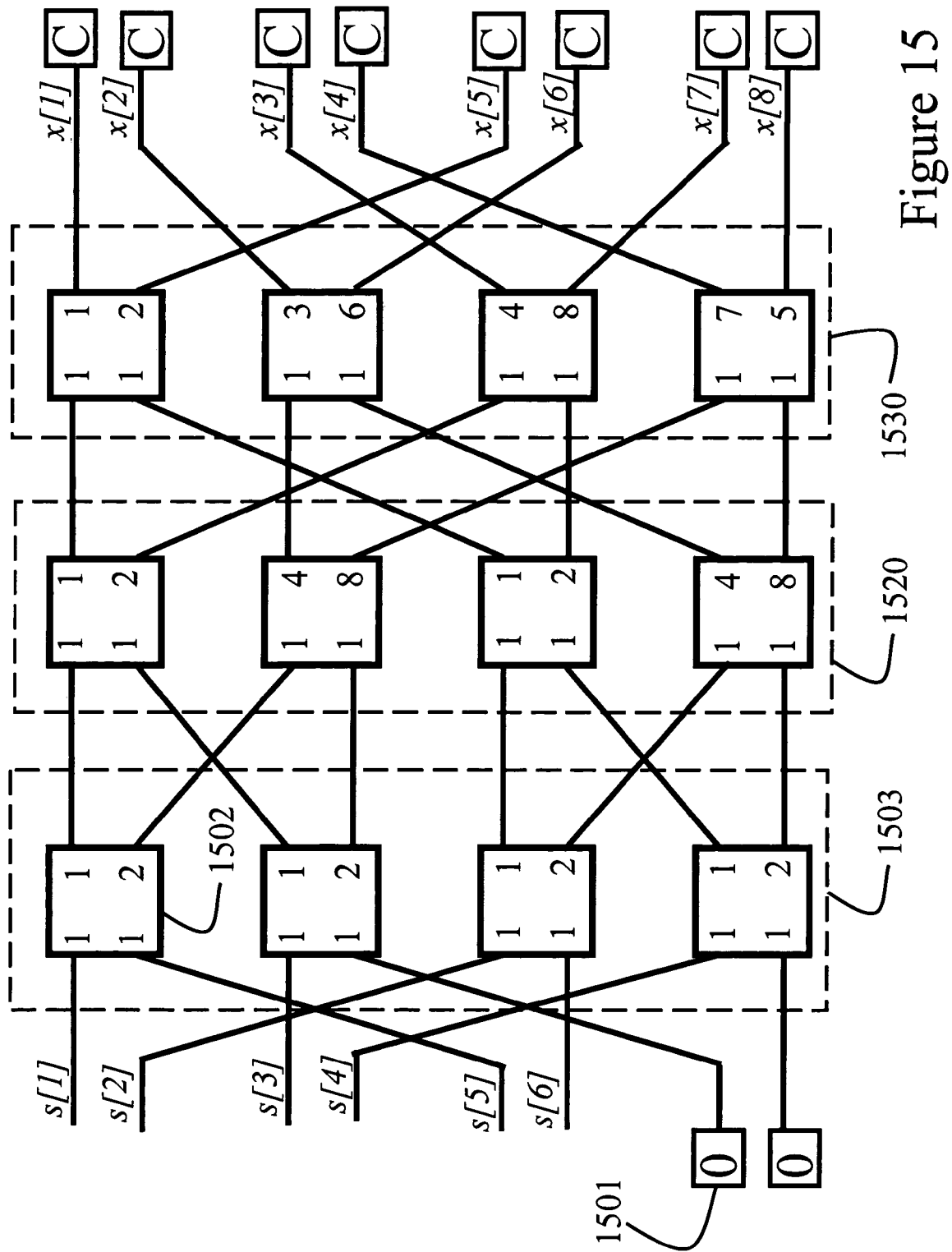
FIG. 15 is a fast sparse transform factor graph (FSTFG) representation of an $[N=8,k=6,d=5]_{q=9}$ Reed-Solomon code.

I define a sparse transform factor graph (STFG) to be a factor graph that implements a transform, using stacked and layered low-rank input-output factor nodes. Thus, the factor graph in FIG. 15 is an example of a sparse transform factor graph according to the invention.

The sparse transform factor graph is defined to be a fast sparse transform factor graph (FSTFG) if the number of layers is much smaller than n, and more particularly, if the number of layers is of order $\log_2$ (M). This terminology has been chosen to be consistent with the terminology of the so-called "fast Fourier transform."

The fast property of FSTFG's is important because it means that the graphs only use a relatively smaller number of input-output factor nodes, which reduces the complexity of the computations needed by my decoding method.

Therefore, I use FSTFG representations of codes rather than simply sparse transform factor graphs in the preferred embodiment of my invention. There may be cases, however, where fast representations are not easily constructed, but a sparse transform factor graph representation is still useful.

FSTFG Representations of Reed-Solomon Codes

Fast sparse transform graphs can be used to help represent a variety of codes, including Reed-Solomon codes. After working through some examples, I will define specifically what I mean by FSTFG codes.

Recall that the Reed-Solomon code word x[n] can be obtained from an information block s[a] according to the formula $$x[n] = \sum_{a=1}^{k} a^{(a-1)(n-1)} s[a]. \quad (22)$$

This formula has the form of a discrete Fourier transform over a finite field, where N–k input variables have been set to zero.

Discrete Fourier transforms where N is a power of 2 can be calculated using the fast Fourier transform (FFT) method. For background on FFT's, see T. H. Cormen, C. E. Leiserson, and R. L. Rivest, "*Introduction to Algorithms*," MIT Press, 1990, chapter 32. The theory of FFT's is now very well-developed. This theory can also be used to construct 1010 FSTFG representations of Reed-Solomon codes.

I emphasize that FSTFG representations also exist for codes whose code words are not obtainable as discrete Fourier transforms of their information blocks. I give some examples of such representations and codes below. Fast Fourier transforms are examples of fast sparse transforms, but the concept of a fast sparse transform according to the invention is more general than the concept of a fast Fourier transform.

Nevertheless, I use the theory of fast Fourier transforms to construct FSTFG representations of Reed-Solomon codes. An FSTFG representation of the $[N=8,k=6,d=5]_{q=9}$ Reed-Solomon code, with generator matrix given in equation (19), is shown in FIG. 15. Note that it is identical to the factor graph shown in FIG. 14, except that some additional factor nodes have been added. The factor graph of FIG. 14 was obtained using the theory of fast Fourier transforms.

The additional factor nodes in the factor graph of FIG. 15, compared to the factor graph of FIG. 14, are factor nodes that either constrain some input variables to be zero, or factor nodes that correspond to soft constraints.

In the FSTFG representation of the Reed-Solomon code, the M output variables of the transform correspond to the N symbols in a code word, and M=N. Each output variable is connected to a soft-input constraint factor node that represents the cost of the corresponding codeword symbol can be in its possible states according to the channel.

In the FSTFG representation of the Reed-Solomon code, the input variables of the transform correspond to the k symbols in the information block for the code. Because there are actually M=N input variables in the transform, N–k of the input variables are constrained to be zero, leaving k free input variables. I draw a constraint factor node that constrains a variable to be zero with a square 1501 that contains a '0'.

I now show that the FSTFG representation in FIG. 15 indeed corresponds to the $[N=8,k=6,d=5]_{q=9}$ Reed-Solomon code with generator matrix given by equation (19). I call the unconstrained input variables, which correspond to the information symbols for this code, s[1] through s[6] as labeled on FIG. 15. I call the output variables, which correspond to the code word symbols for this code, x[1] through x[8] as labeled on FIG. 15.

Suppose that the first information symbol s[1] is fixed to be a one, and that all other information symbols are fixed to be zeros. This gives an information block 100000. Then, the top input-output factor node 1502 in the first layer 1503 on the left outputs two ones, and all the other input-output factor nodes in the first layer output two zeros. In the second layer 1520, the top two input-output-factor nodes output two ones each, and the bottom two input-output factor nodes output two zeros each. Finally, in the third layer 1530, every input-output factor node will output two ones, so the code word corresponding to the information block 100000 is 11111111. Notice that this is exactly the first row of the generator matrix of the code, as it should be.

Similarly, I verify that the information block 010000 is transformed into the code word 13472685, corresponding to the second row of the generator matrix; and that the information block 001000 is transformed into the code word 14281428, corresponding to the third row of the generator matrix; and so on.

Other FSTFG Codes: Extended Reed-Solomon Codes

Before going further, I give some examples of codes that have FSTFG representations that are not obtainable as fast Fourier Transforms. My first example is the $[N=8,k=4, d=5]_{q=8}$ extended Reed-Solomon code.

Recall that the generator matrix for the $[N=8,k=4,d=5]_{q=8}$ extended Reed-Solomon code can be obtained from the generator matrix of the $[N=7,k=4,d=4]_{q=8}$ Reed-Solomon code by adding one extra column that contains a one in the first row and zeros in all other rows. Thus, the $[N=8,k=4, d=5]_{q=8}$ extended Reed-Solomon code has the generator matrix:

$$G = \begin{pmatrix} 1 & 1 & 1 & 1 & 1 & 1 & 1 & 1 \\ 0 & 1 & 2 & 4 & 3 & 6 & 7 & 5 \\ 0 & 1 & 4 & 6 & 5 & 2 & 3 & 7 \\ 0 & 1 & 3 & 5 & 4 & 7 & 2 & 6 \end{pmatrix}, \quad (23)$$

where I select the primitive element of GF(8) to be 2.

By replacing the third row of this generator matrix with the sum of the second and third rows, and the fourth row with the sum of the second, third, and fourth rows, I obtain another generator matrix for the same code, of the form:

$$G = \begin{pmatrix} 1 & 1 & 1 & 1 & 1 & 1 & 1 & 1 \\ 0 & 1 & 2 & 4 & 3 & 6 & 7 & 5 \\ 0 & 0 & 6 & 2 & 6 & 4 & 4 & 2 \\ 0 & 1 & 5 & 7 & 2 & 3 & 6 & 4 \end{pmatrix}. \quad (24)$$

Figure 16:
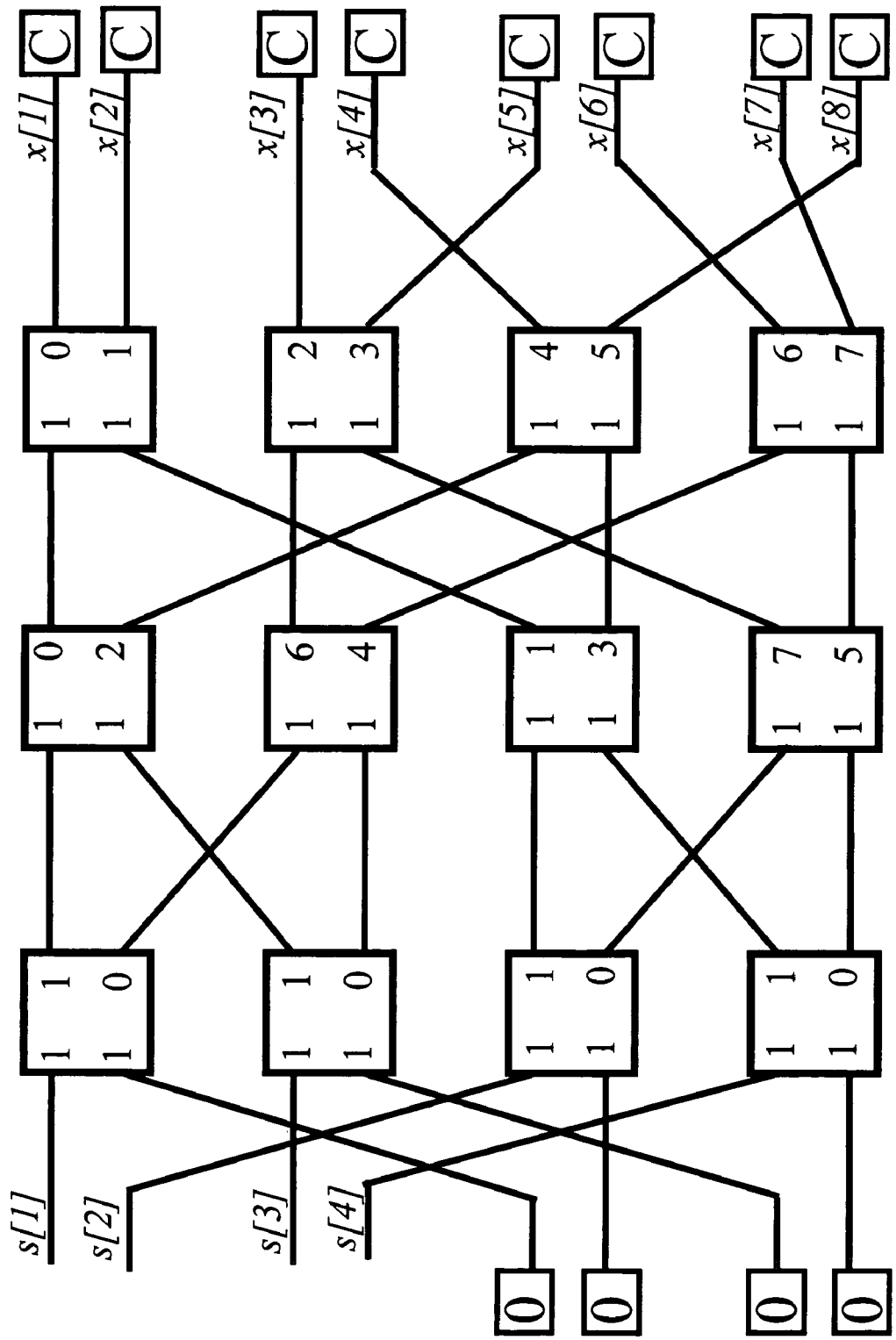
FIG. 16 is a FSTFG representation of an $[N=8,k=4, d=5]_{q=8}$ extended Reed-Solomon code.

In FIG. 16, I give an FSTFG representing the $[N=8,k=4, d=5]_{q=8}$ extended Reed-Solomon code. The fact that this FSTFG represents the code can be verified by fixing the input information blocks to be 1000, 0100, 0010, and 0001, and verifying that the output code words correspond to the four rows of the generator matrix given in equation (24).

Other Ternary and Binary FSTFG Codes

A variety of codes with very good distance properties can be represented as FSTFG codes. As another example, I consider some codes over GF(3).

Figure 17:
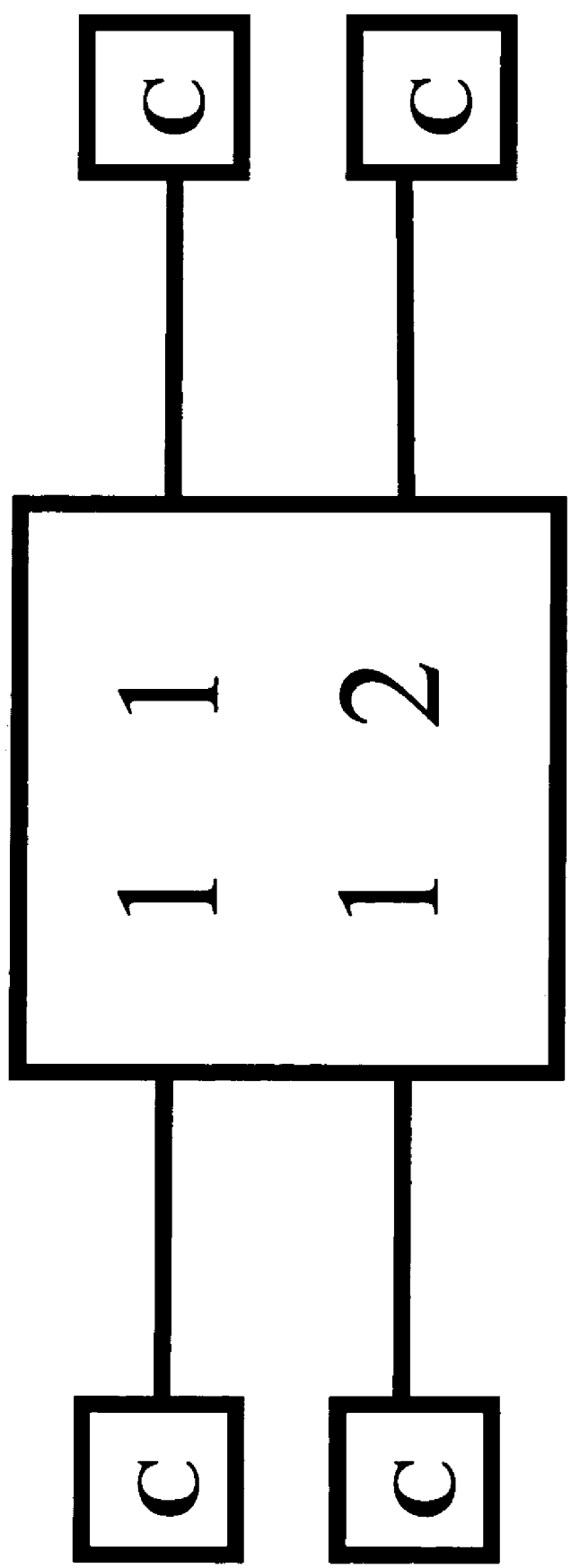
FIG. 17 is a factor graph representation of the tetra-code.

FIG. 17 shows an FSTFG representation of the $[N=4,k=2, d=3]_{q=3}$ tetra-code, which has optimal distance given the other parameters of the code.

The tetra-code uses only one input-output factor node in its factor graph representation. Larger codes over GF(3) can be represented using fast sparse transform factor graphs constructed by stacking and layering the same input-output factor node.

Figure 18:
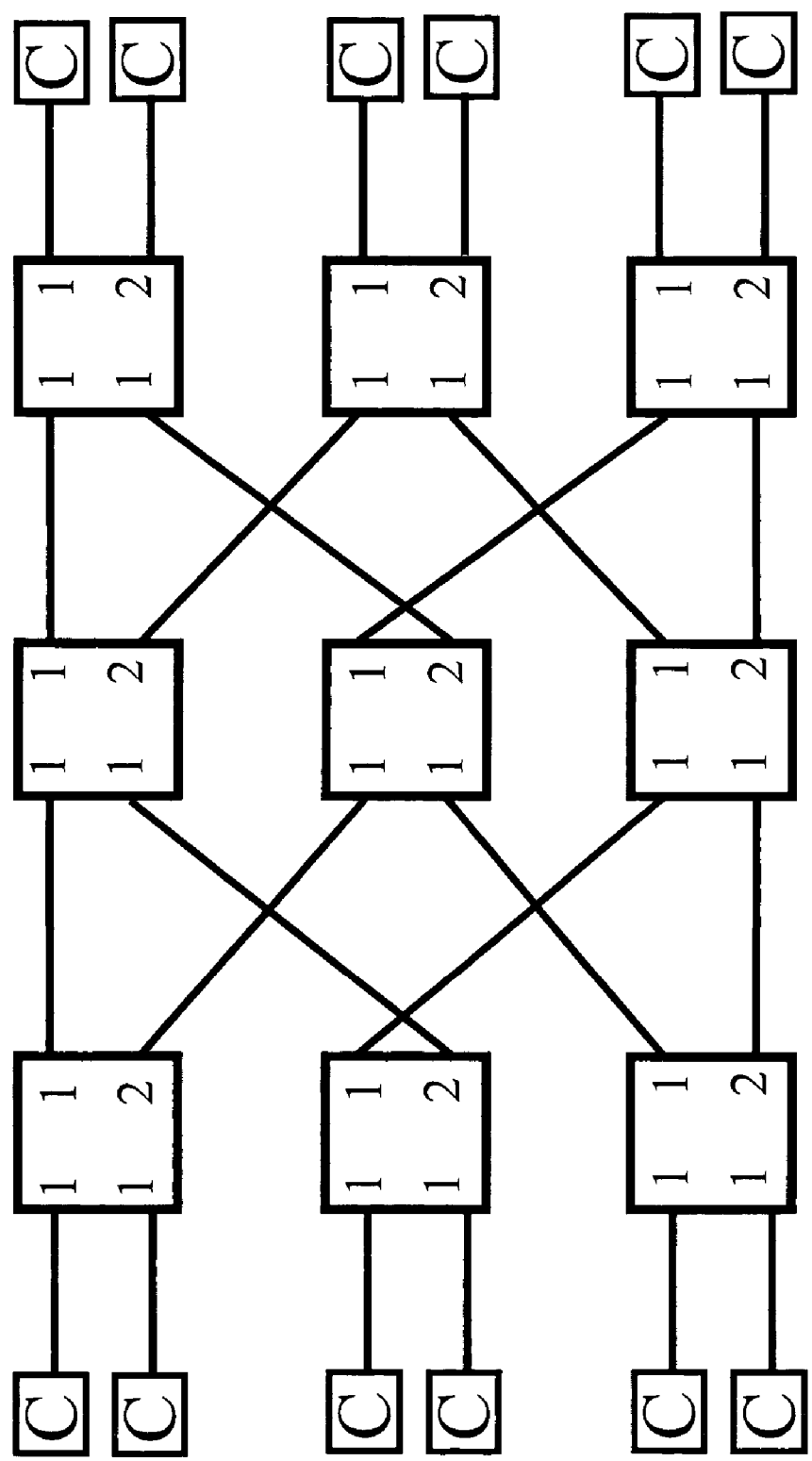
FIG. 18 is an FSTFG representation of the $[N=12,k=6, d=6]_{q=3}$ extended ternary Golay code.

For example, FIG. 18 shows an FSTFG representation of an $[N=12,k=6,d=6]_{q=3}$ code. This code, known as the "extended ternary Golay code," also has optimal distance given its other parameters.

Note that the representations of the tetra-code and the ternary Golay code use soft-input constraint factor nodes at both the input and output variables of the transform. I can also define codes using FSTFG representations that connect soft-input constraint factor nodes to the internal variables of the transform. Any variable that is connected to a soft-input constraint factor node will correspond to a code word symbol.

Figure 19:
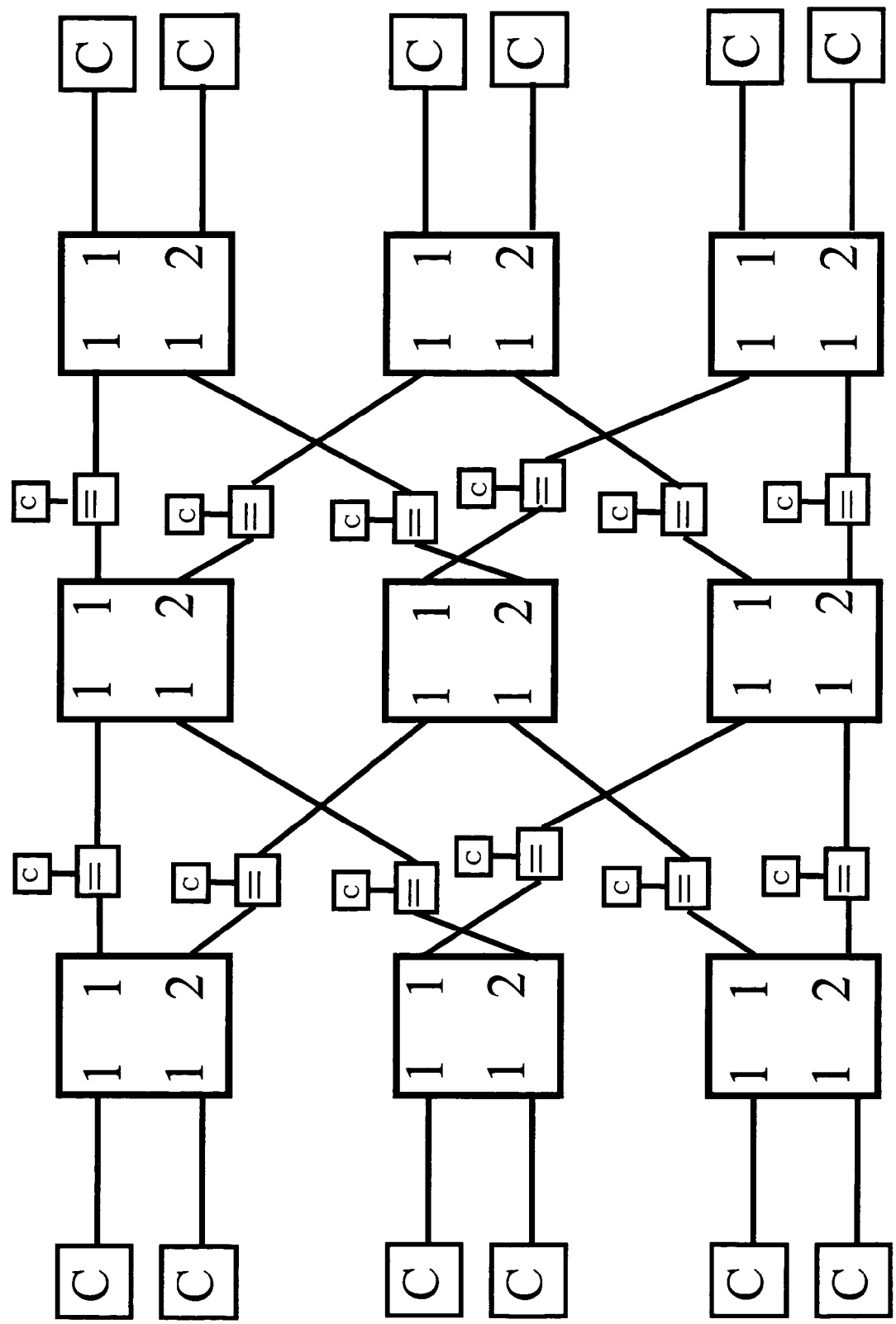
FIG. 19 is an FSTFG representation of an $[N=24,k=6]_{q=3}$ code.

FIG. 19 shows an example of an $[N=24,k=6]_{q=3}$ code where the internal variables of the transform also serve as code word symbols.

Some particular binary codes also have factor graph representations that are similar to the FSTFG representation. In particular, Forney's representation of Reed-Muller codes, see G. D. Forney, Jr., "*Codes on Graphs: Normal Realizations,*" IEEE Transactions on Information Theory, vol. 47, pp. 520–548, February 2001, and Carlach et al.'s representation of self-dual binary codes, see J.-C. Carlach and A. Otmani, "*A Systematic Construction of Self-Dual Codes,*" IEEE Transactions on Information Theory, vol. 49, pp. 3005–3009, November 2003, can be converted into FSTFG representations.

However, I must emphasize that nobody has previously described anything resembling FSTFG representations for non-binary codes, of which the Reed-Solomon codes are the best known examples.

Moreover, nobody has previously used rank two input-output factor nodes in their representations of codes. For example, Forney uses hard-constraint equality and exclusive- or factor nodes, while Carlach, et al. use extended Hamming code factor nodes.

The fact that I use rank two input-output factor nodes is a key ingredient to the decoding method described in detail below, because this enables me to use a message-update method that efficiently and simultaneously accounts for the two constraints in a rank two input-output factor node.

Definition of an FSTFG Code, and a Standard FSTFG Representation

I now define formally the FSTFG code. The $[N,k]_q$ FSTFG code is a code that can be represented using the FSTFG. The FSTFG has M q-ary input and output variables, and where N of the input, internal, or output transform variables in the FSTFG are also connected to soft-constraint factor nodes, and M−k of the input variables in the FSTFG are connected to factor nodes that constrain the input variables to equal zero.

Hard-constraint equality constraint factor nodes can also be included in the factor graph representation if they are needed to copy internal transform variables that are connected to soft-constraint factor nodes.

I call such a FSTFG representation of a code a "standard" FSTFG representation. All the examples of FSTFG representations shown in the Figures so far have been standard FSTFG representations.

FSTFG codes can sometimes also be represented using factor graphs that are created by simplifying or making redundant a standard FSTFG representation.

Sparse transform factor graph codes that are not fast are defined in an analogous way, using sparse transform factor graph representations that have many layers.

Simplifying an FSTFG Representation of a Code

It is usually possible to simplify an FSTFG representation of a code. These simplifications are useful, because the simplifications reduce the number and complexity of the input-output factor nodes in the representation. In any hardware implementation of the invention, this corresponds to a decrease in the number of processors and connections that are used. The simplifications can also improve the performance of the decoding method, to be described later. I describe a variety of possible simplifications that are possible. Other similar simplifications in the same spirit are possible.

I describe simplifications that occur when the input variables of an input-output variable node are not connected to factor nodes or are connected to factor nodes that constrain the variables to equal zero, while the output variables are connected to arbitrary other collections of factor nodes. Similar simplifications occur when the situation is reversed between the input and output variables.

If the two input variables in an input-output factor node are each connected to a factor node that constrains the variables to equal zero, then I can be certain that the output factor nodes must also equal zero. I can therefore, in this case, remove the input-output factor node, and directly connect the input and output variables.

Figure 20:
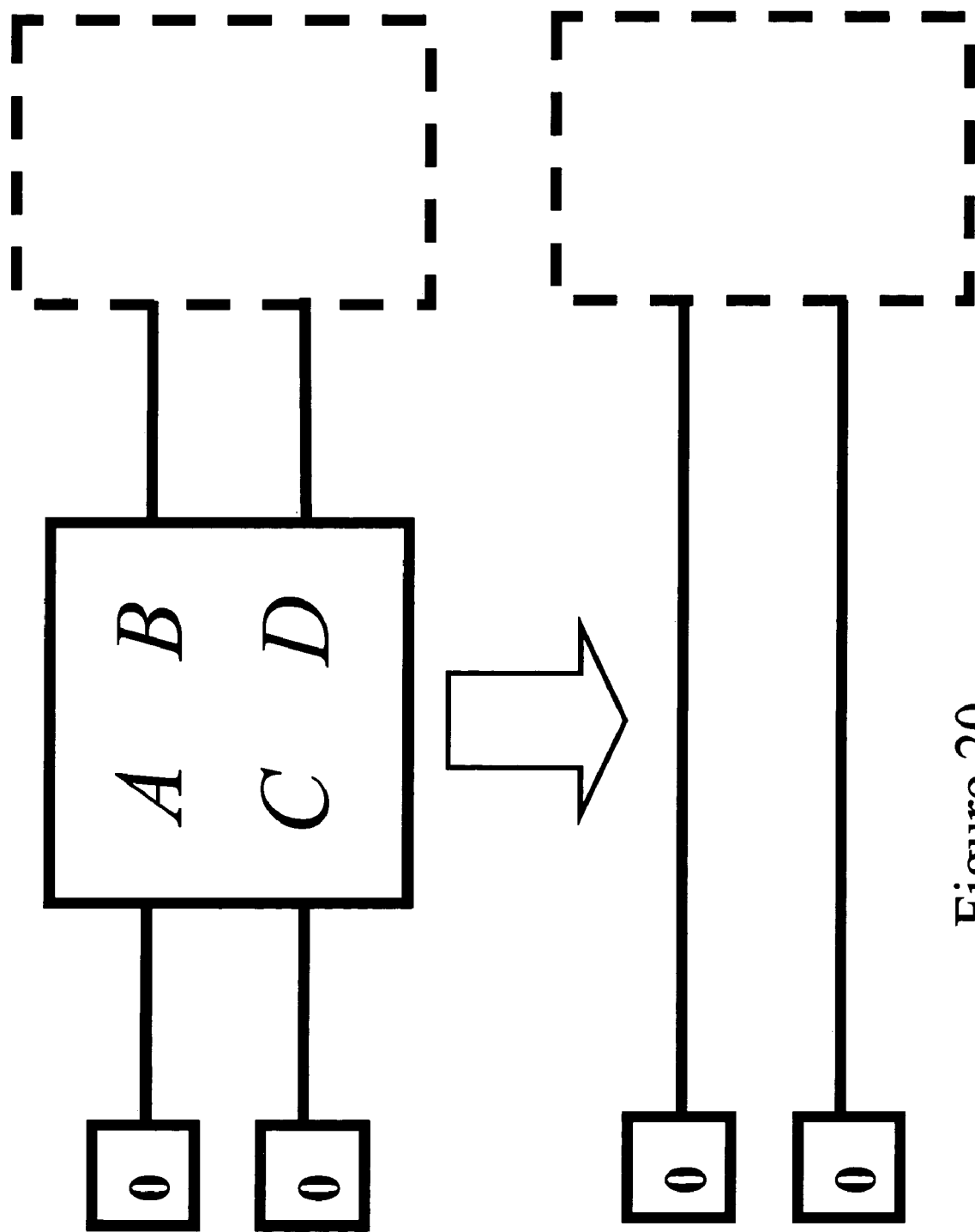
FIG. 20 is a simplification rule for fast sparse transform factor graphs.

FIG. 20 shows a graphical depiction of this simplification. The dashed box in FIG. 20, and in the following Figures represents an arbitrary collection of factor nodes and connections between them.

Figure 21:
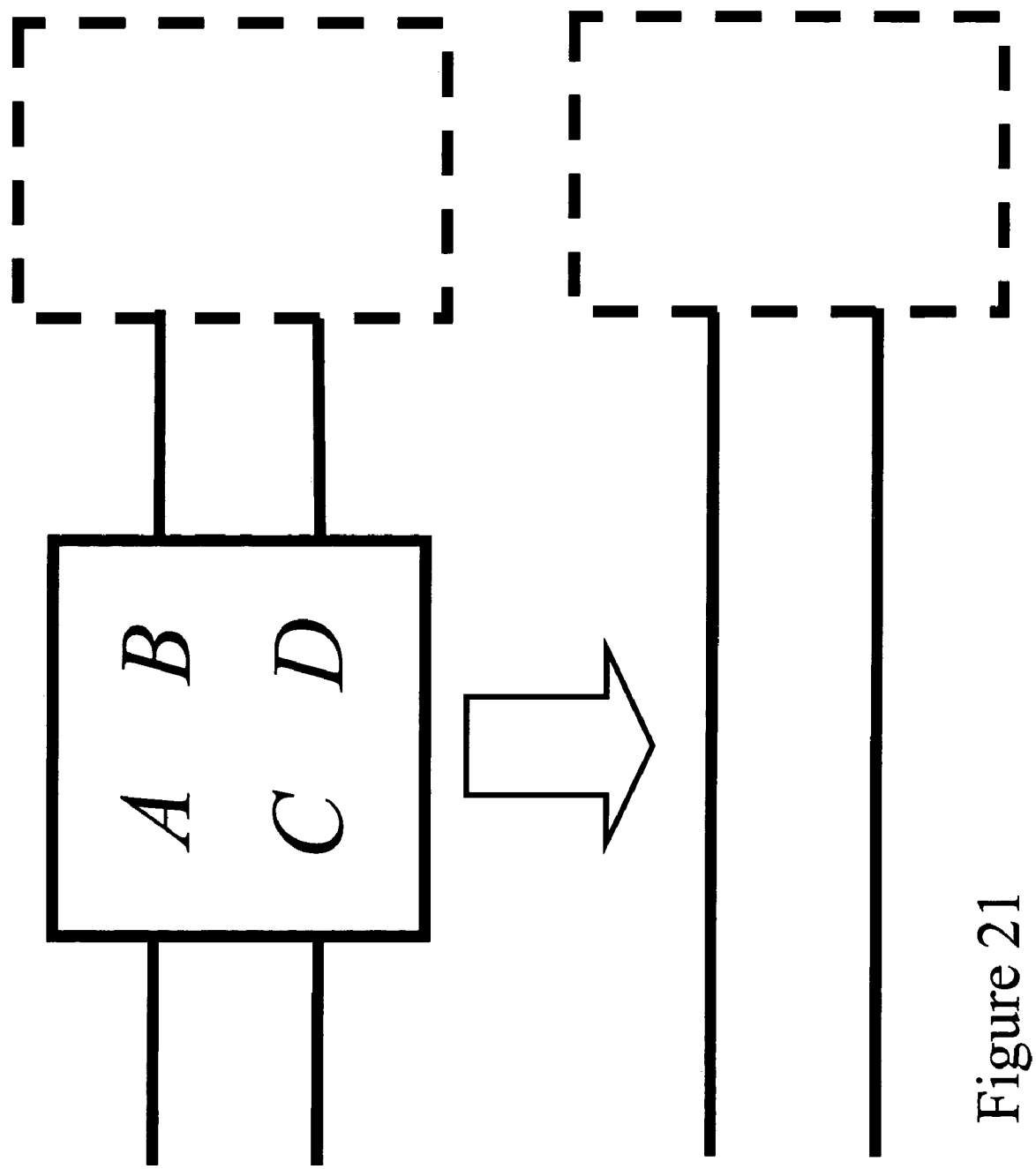
FIG. 21 is a simplification rule for fast sparse transform factor graphs.

If the two input variables in an input-output factor node are each not connected to any other factor nodes, then the input variables are equally likely to assume each of the possible q states. This means that the output variables are equally likely to assume each of the possible q states. I can therefore also, in this case, remove the input-output factor node, and directly connect the input and output variables. FIG. 21 shows a graphical depiction of this simplification of FIG. 20.

If one of the input variables in an input-output factor node is connected to a factor node that constrains it to equal zero, and the other is not connected to any other factor nodes, then I can simplify the input-output factor node by removing the two input variables, and replacing the factor node with one that reflects the enforced relationship between the two output variables. If the two output variables equal to each other after the simplification, then the factor node can be simply replaced by a line connecting the output variables.

Figure 22:
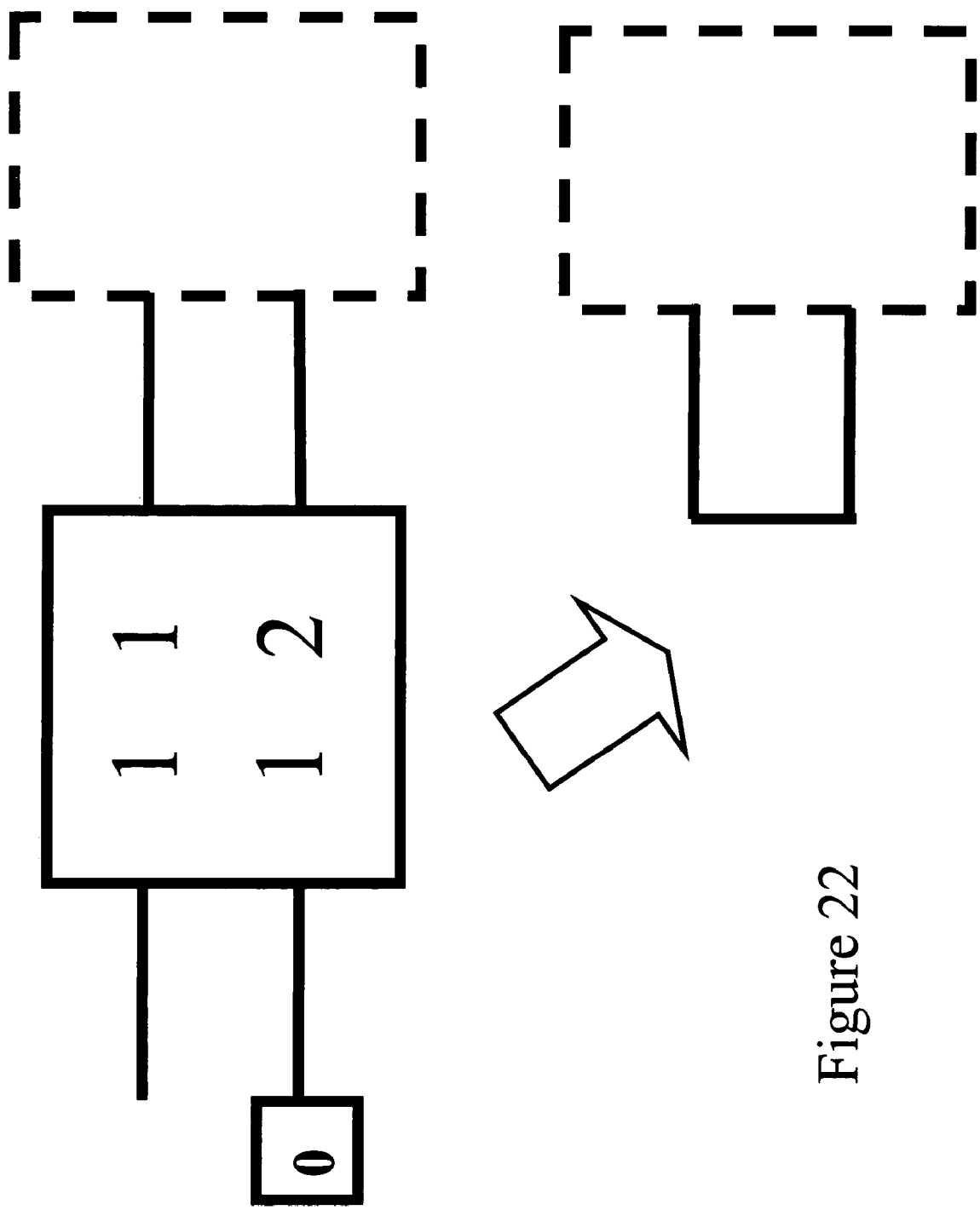
FIG. 22 is a simplification rule for fast sparse transform factor graphs.

For example, if the input-output variable node enforced the two constraints $y[1]=x[1]+x[2]$ and $y[2]=x[1]+2x[2]$, and I know that $x[2]=0$ because the second input variable is connected to a factor that forces it to equal zero, than I can infer that $y[1]=y[2]$, because they both equal $x[1]$. FIG. 22 shows a graphical depiction of this simplification.

Figure 23:
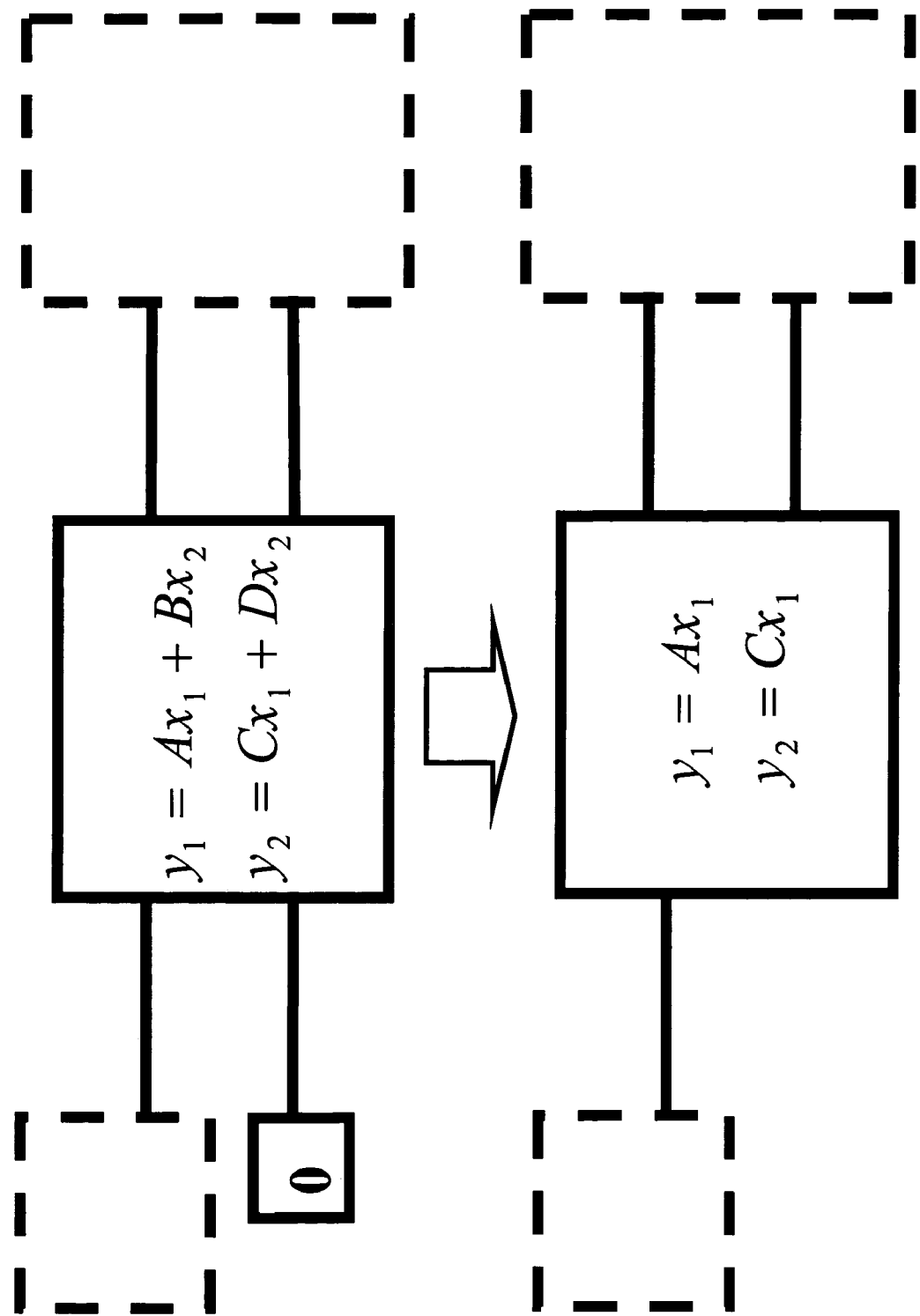
FIG. 23 is a simplification rule for fast sparse transform factor graphs.

If a single input variable of an input-output factor node is connected to a constraint node that fixes it to equal zero, then the input-output factor node can be simplified by removing the input variable constrained to equal zero, and simplifying the constraint equations by setting the variable equal to zero. FIG. 23 shows a graphical depiction of this simplification.

In FIG. 23, as in some of the following Figures, I draw factor nodes that are derived from input-output factor nodes in the same manner as input-output factor nodes themselves. Variables entering on the left are given the labels $x[1]$ and $x[2]$ starting from the top, variables entering on the right are given the labels $y[1]$ and $y[2]$, and the constraints relating the variables are written inside the square.

Figure 24:
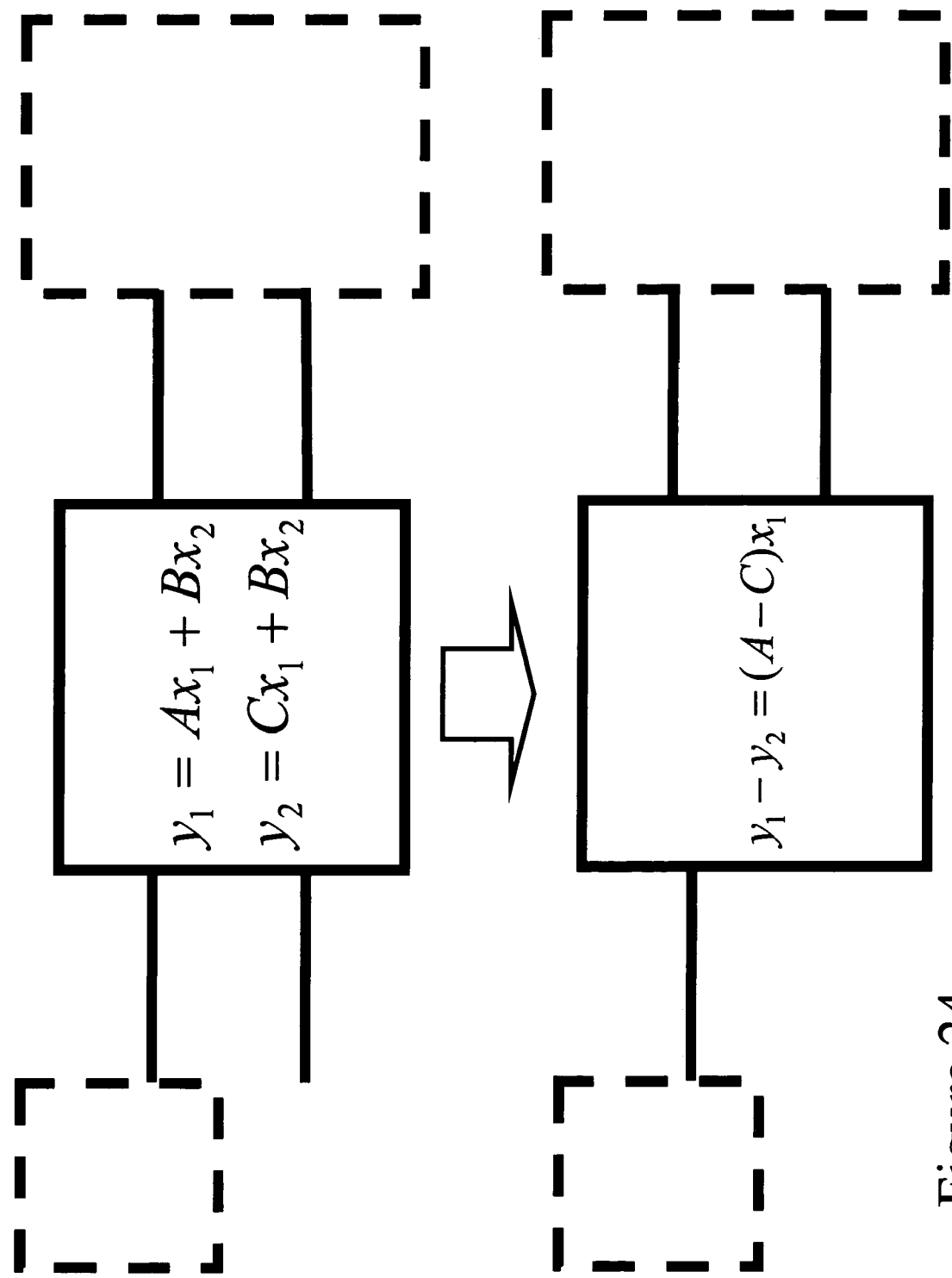
FIG. 24 is a simplification rule for fast sparse transform factor graphs.

If a single input variable of an input-output factor node is not connected to any other factor node, then the input-output factor node can be simplified by removing the input variable that is not connected to any other factor node, and simplifying the constraint equations. FIG. 24 shows an example of this simplification.

If two input-output factor nodes are arranged such that the output variables of the first one are the input variables of the second one, than the two input-output factor nodes can be replaced by a single one.

Figure 25:
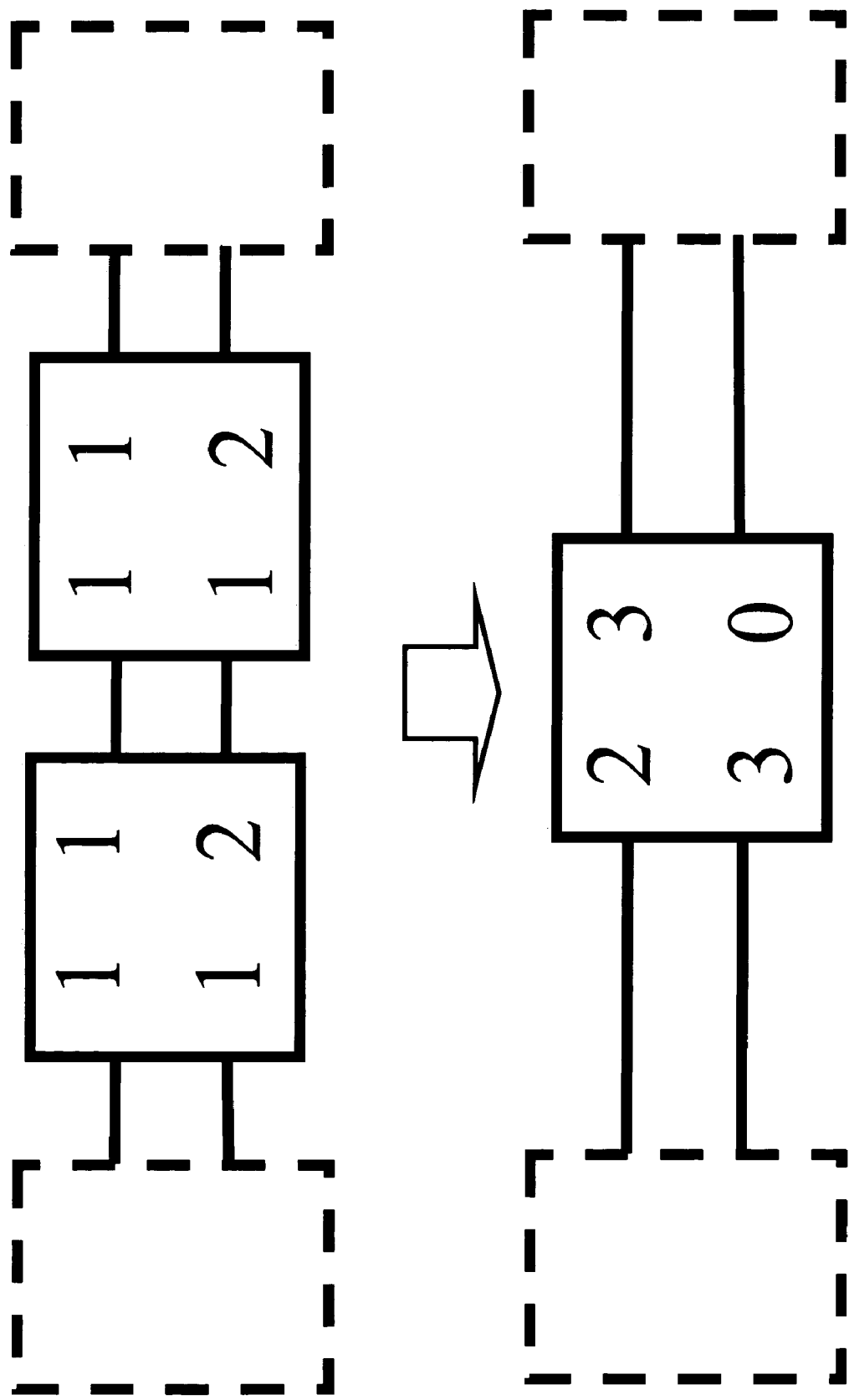
FIG. 25 is a simplification rule for fast sparse transform factor graphs.
Figure 26:
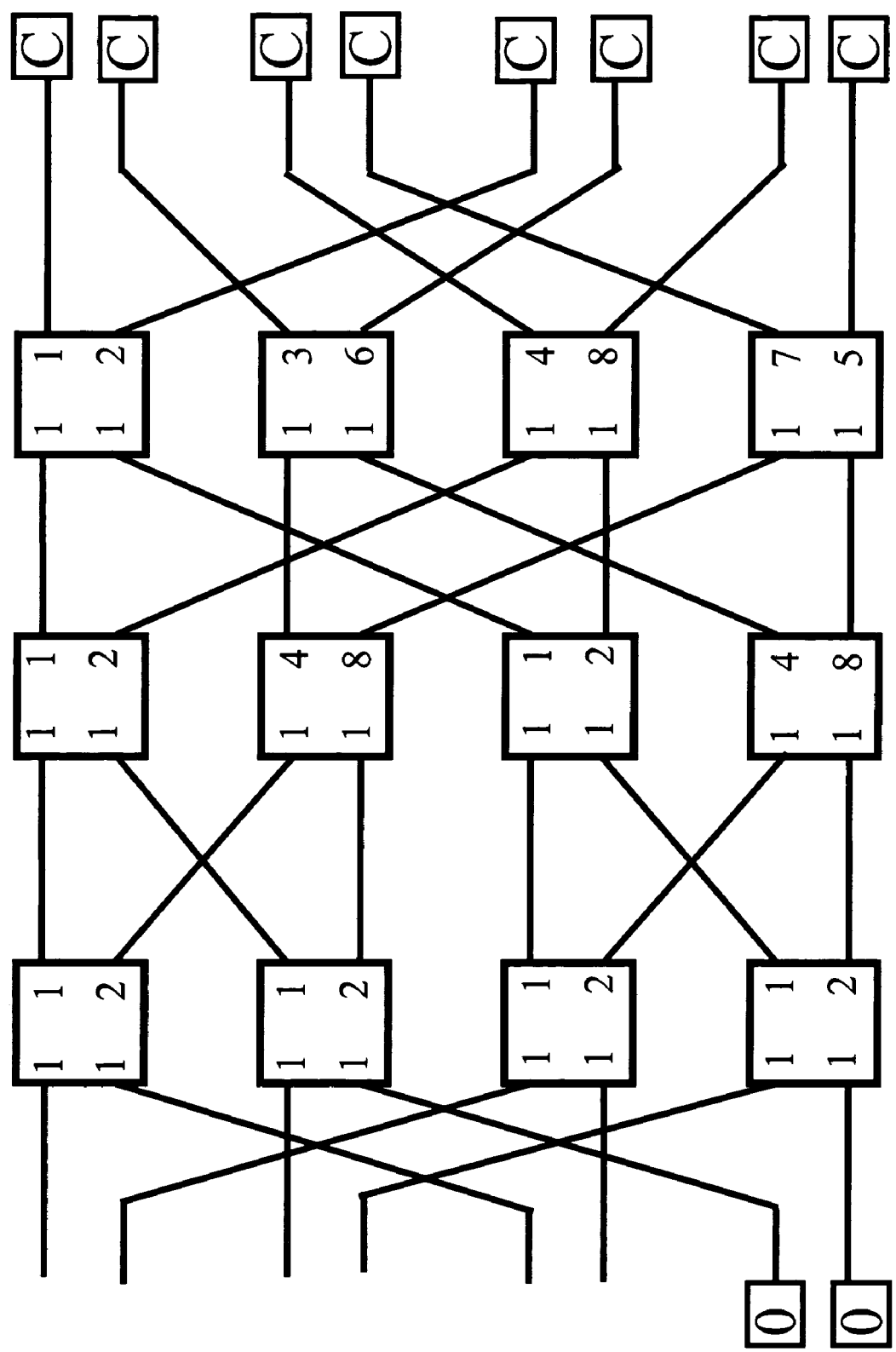
FIG. 26 is a FSTFG representation of an $[N=8,k=6, d=5]_{q=9}$ Reed-Solomon code.
Figure 27:
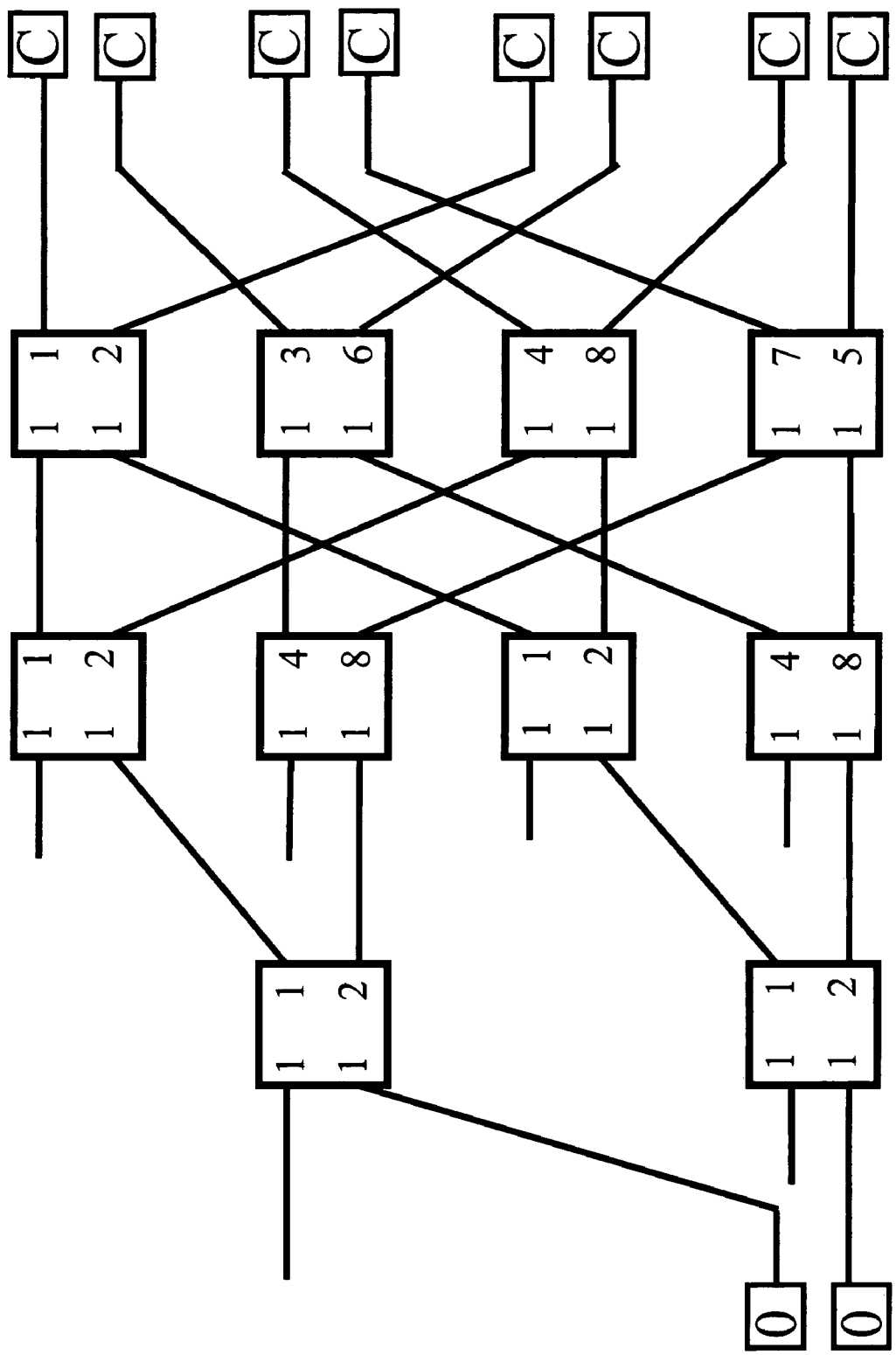
FIG. 27 is a simplified FSTFG representation of the $[N=8,k=6,d=5]_{q=9}$ Reed-Solomon code of FIG. 26.
Figure 28:
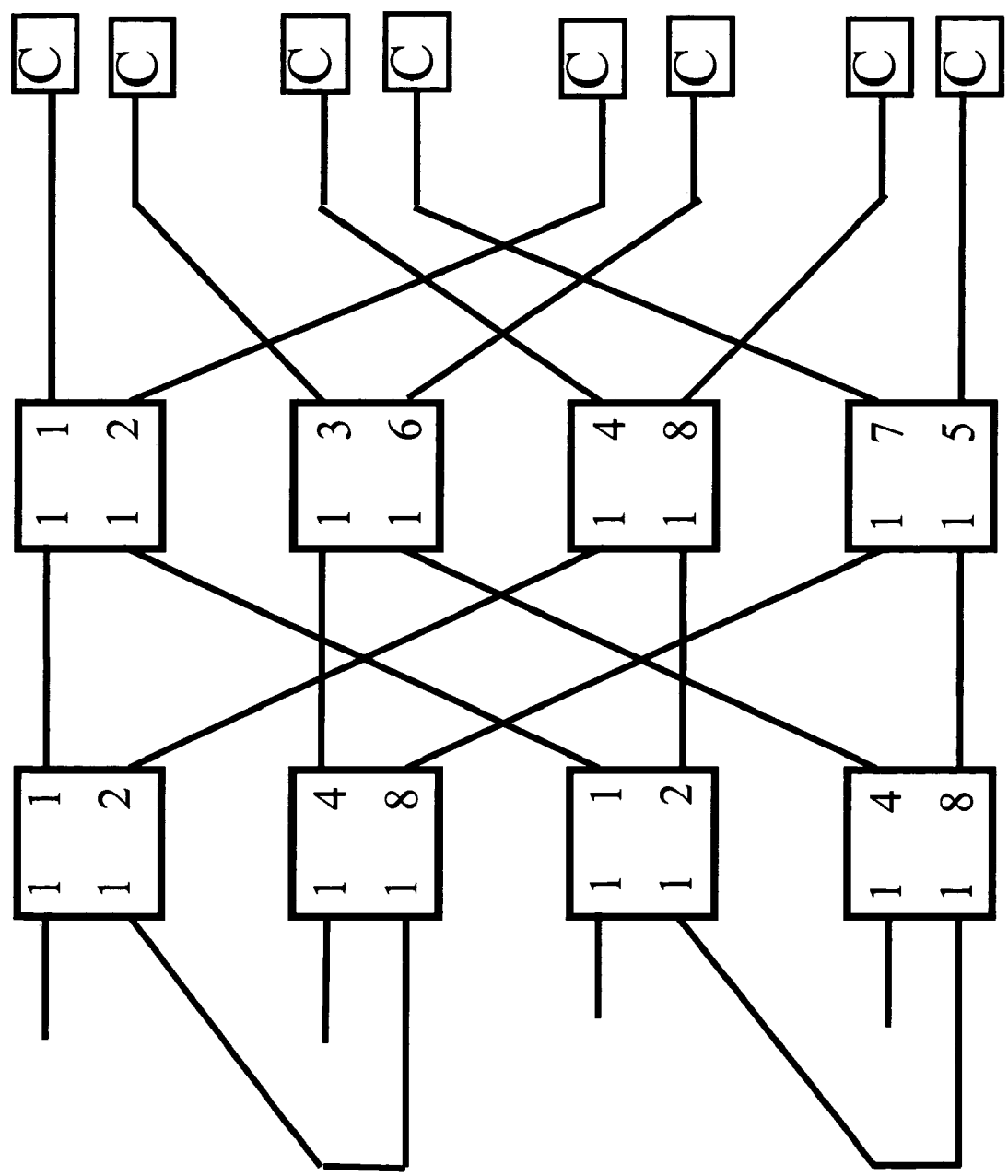
FIG. 28 is a more simplified FSTFG representation of the $[N=8,k=6,d=5]_{q=9}$ Reed-Solomon code of FIG. 27.
Figure 29:
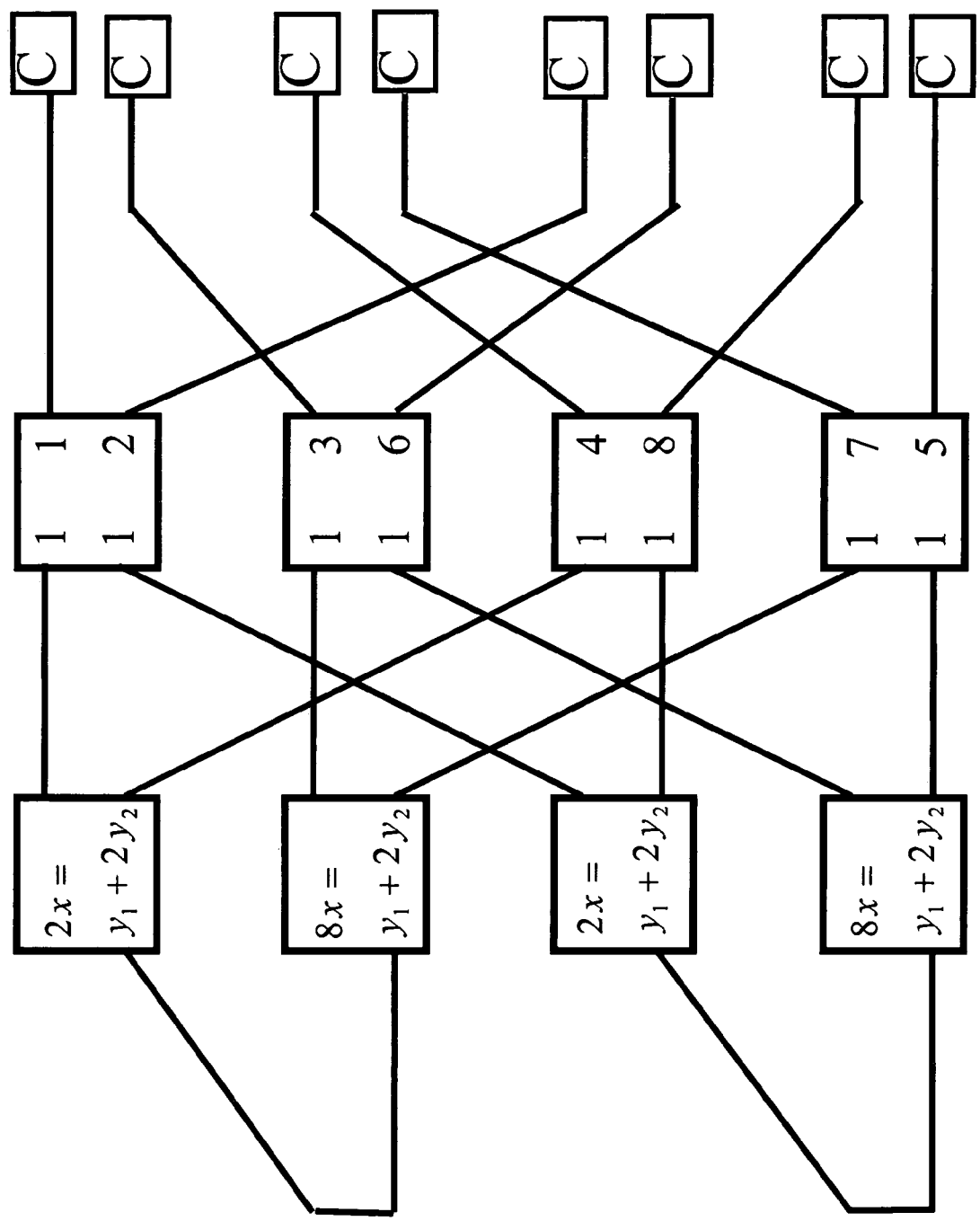
FIG. 29 is a more simplified FSTFG representation of the $[N=8,k=6,d=5]_{q=9}$ Reed-Solomon code of FIG. 28.
Figure 30:
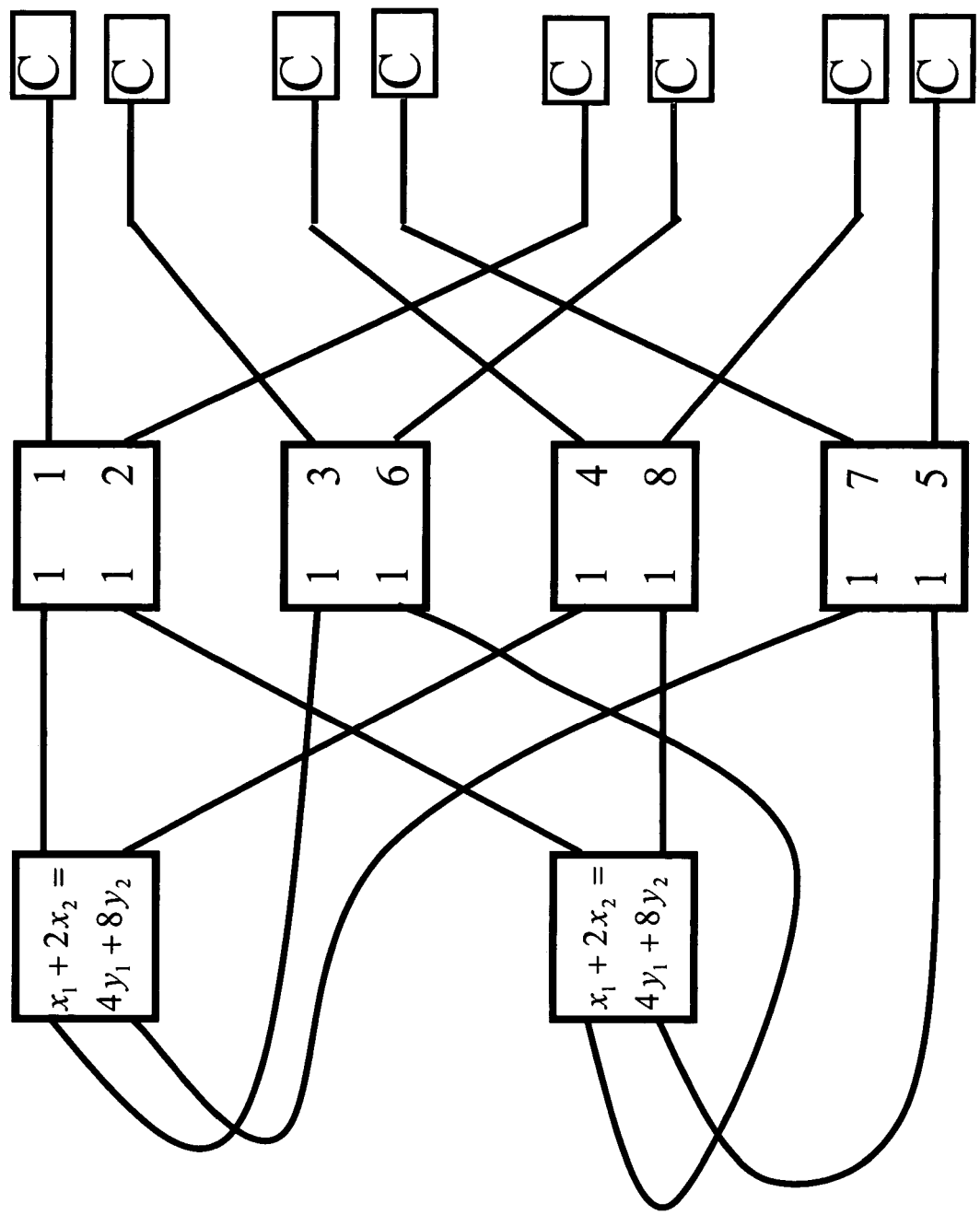
FIG. 30 is a more simplified FSTFG representation of the $[N=8,k=6,d=5]_{q=9}$ Reed-Solomon code of FIG. 29.

As an example for GF(5) and both input-output factor nodes enforce the constraints $y[1]=x[1]+x[2]$ and $y[2]=x[1]+2x[2]$, where the first output of the first factor node is the first input of the second factor node, and the second output of the first factor node is the second input of the second factor node. In this case, I use algebra to derive that the two combined input-output factor nodes are equivalent to a single input-output factor node enforcing the constraints $y[1]=2x[1]+3x[2]$ and $y[2]=3x[2]$. FIG. 25 is a graphical depiction of this simplification.

It may sometimes aid simplification to invert an input-output factor node, so that its inputs become its outputs, and vice versa. This can be achieved by solving the constraint equations for the outputs in terms of the inputs.

FIGS. 26–30 show representations of the $[N=8,k=6, d=5]_{q=9}$ Reed-Solomon code. Each successive Figure shows a representation that is a simplification of the representation in the previous Figure, made using the simplification rules given above.

Redundant Representations of FSTFG Codes

Very often, more than one standard or simplified FSTFG representation of an FSTFG code exists. It is sometimes useful to combine several representations to generate a redundant representation.

As previously mentioned, redundant factor graph representations that are not FSTFG representations have sometimes given improved decoding performance for codes that are not FSTFG codes. Redundant FSTFG representations also improve decoding performance when using the message-passing decoding methods described below. The intuitive reason that redundant representations can improve performance is that there are more ways to infer the correct state of code word symbols.

It may seem counter-intuitive that FSTFG representations are first simplified, and then made redundant. In fact, this can be useful, analogous to the way that messages are first compressed, and then adding redundant bits to combat channel noise. By simplifying the FSTFG representations, I make the messages in a decoding method more informative, and by using redundant representations, I add alternative ways for any code word symbol to be inferred.

On the other hand, redundant factor graph representations use more factor nodes. The improved performance of a redundant representation may not always be worthwhile, given the extra complexity.

I generate a redundant representation by exploiting symmetries of the code, in particular, those transformations of the code word symbols that take one code word into another. For example, if a code has cyclic symmetry, then the code words can be shifted cyclically to obtain another code word. Therefore, if I have an FSTFG representation of a cyclic code, and I shift cyclically all the variables corresponding to code word symbols, I obtain another FSTFG representation of the same cyclic code, because the two representations have the same code words.

Figure 31:
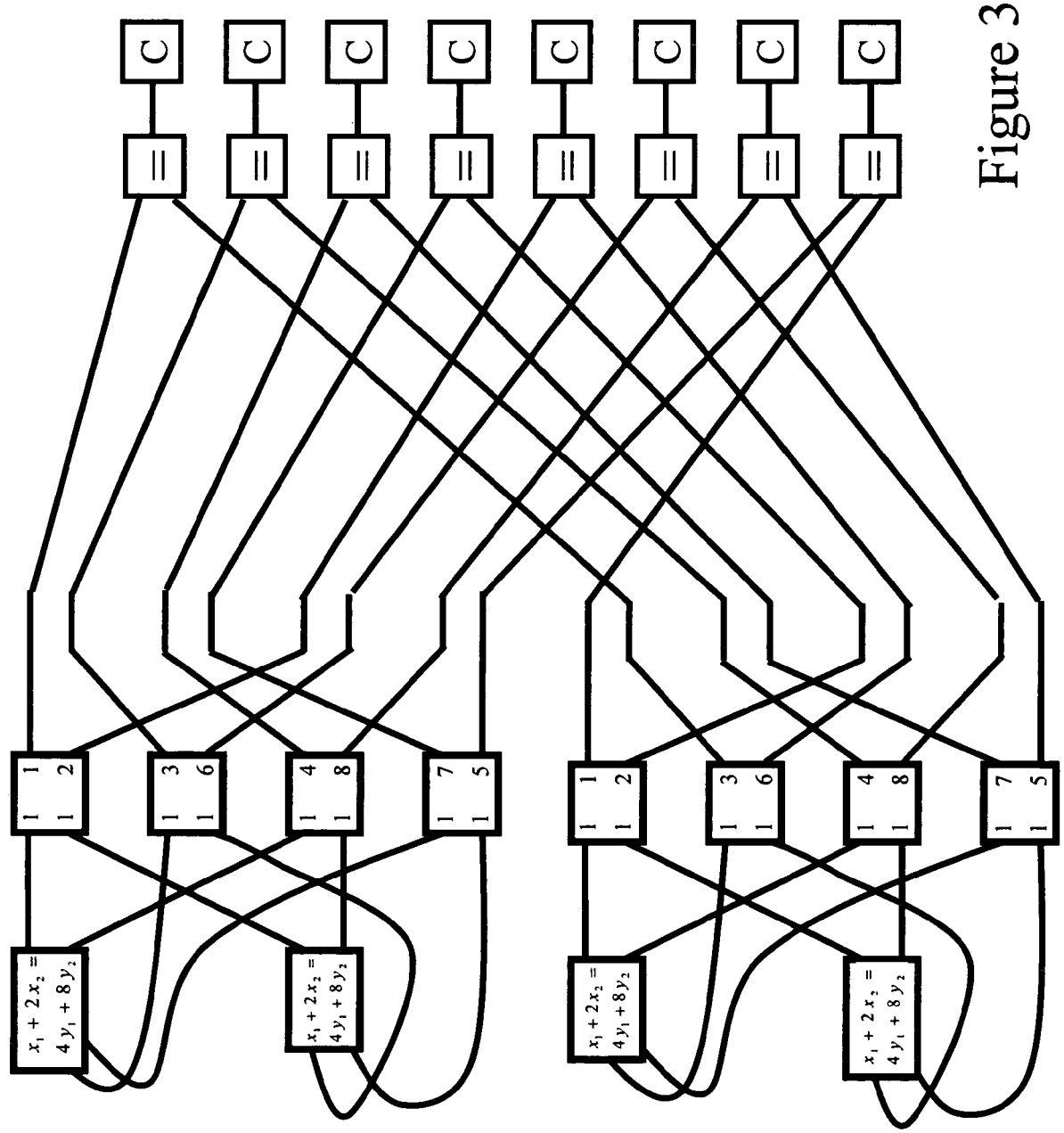
FIG. 31 is a redundant FSTFG representation of an $[N=8,k=6,d=5]_{q=9}$ Reed-Solomon code.

Reed-Solomon codes are in fact cyclic codes. In FIG. 31, I show a redundant representation of the $[N=8,k=6,d=5]_{q=9}$ Reed-Solomon code, obtained by starting with the simplified representation of FIG. 30, and combining the representation with another representation obtained by cyclically shifting the code word symbols in the representation of FIG. 30.

Encoding an FSTFG Code

Encoding methods 1021 for codes are essential, although it is normally much easier to obtain a good encoding method for a code than it is to obtain a good decoding method. My decoding method for FSTFG codes relies on the fact that there is a selected encoding method 1022, see FIG. 10.

A variety of encoders 1021 can be built for any FSTFG code. First. I describe an encoder for $[N,k]_q$ FSTFG codes represented using a standard FSTFG representation. Recall that a standard FSTFG has M input variables, of which M–k are connected to a factor node, which constrains the variables to equal zero. The other k input variables are taken to correspond to the k symbols of an information block.

When an information block of k symbols is to be encoded, I fix the corresponding k input variables to their values as given by the information block. Together with the M–k input variables fixed to be zero, I thereby fix all M input variables in the standard FSTFG representation of my code.

Using the M input variables, I can then use the input-output factor nodes in the first layer of the FSTFG to compute the values of the M internal variables that are the outputs of the first layer of the FSTFG. From these M variables, I compute the variables that are the outputs of the second layer of the FSTFG, and so on, until all the variables in the FSTFG are computed.

Then, I identify the N variables in the standard FSTFG representation that are connected to soft-input constraint factor nodes with the code word symbols. The output code word of the encoder assigns the value of the corresponding variable in the FSTFG representation to each code word symbol. I call this encoding method the "standard feed-forward encoder."

In addition to the standard feed-forward encoder, other non-standard encoders for an FSTFG code can be obtained by selecting any set of k variables in an FSTFG representation, such that all the other variables in the factor graph can be determined systematically using the constraints in the input output factor nodes. After the N variables corresponding to code word symbols are determined, the encoder can output the corresponding code word.

An "arrow diagram" can be made for any standard or non-standard encoder, by adding arrows to the connections in the FSTFG 1011. The arrows represent the information flow in the encoder. That is, the arrows represent how some of the variables are determined from other variables. All of the factor nodes have a sufficient number of variables with arrows pointing in so that the variables with arrows pointing out can be determined using the variables with arrows pointing in. All of the variables corresponding to the k information symbols have arrows flowing to each of the factor nodes to which they are connected.

Figure 32:
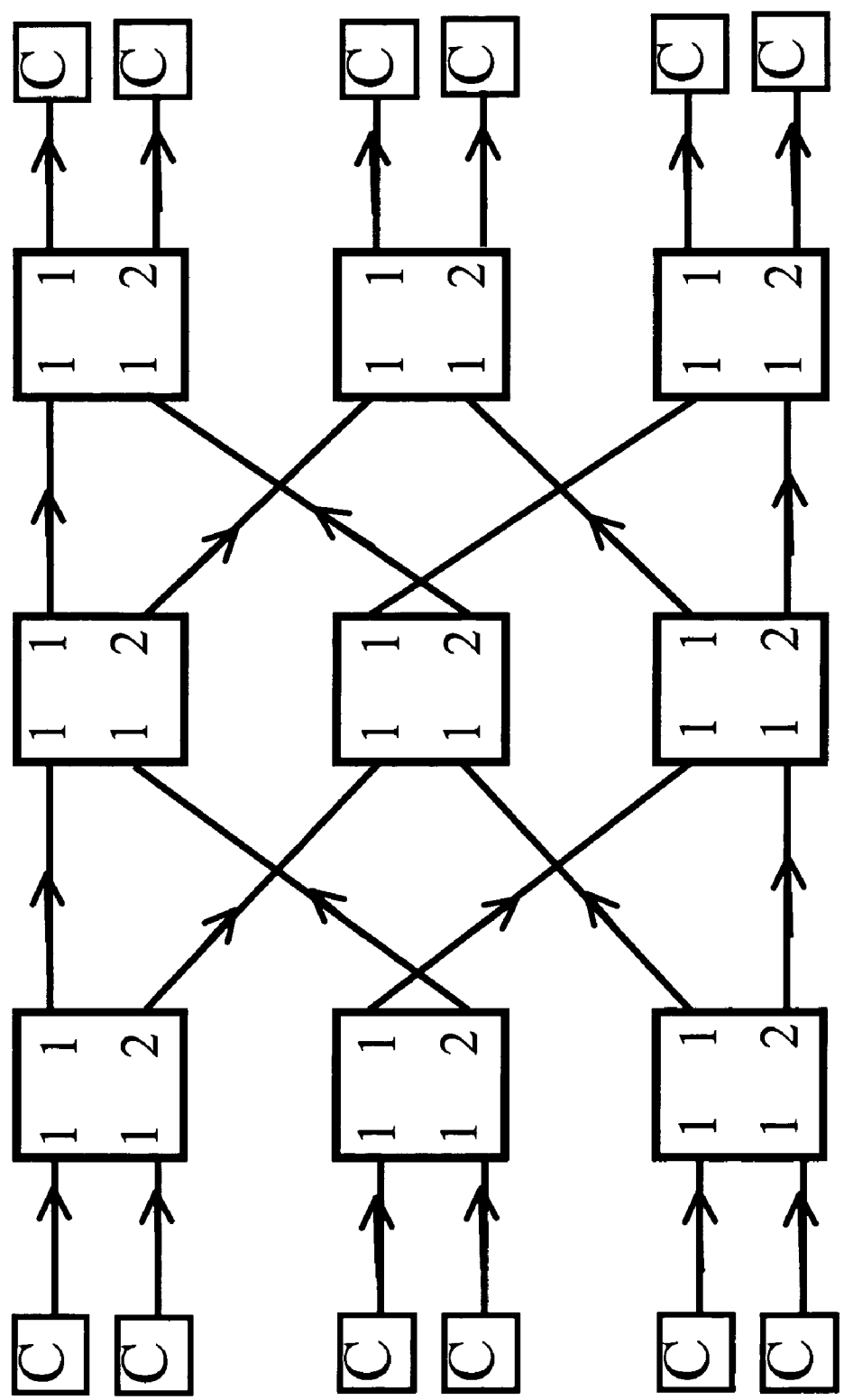
FIG. 32 is an arrow diagram for a standard feed-forward encoder of the ternary extended Golay code.

In FIG. 32, I show an example of a standard feed-forward encoder for the ternary extended Golay code.

Figure 33:
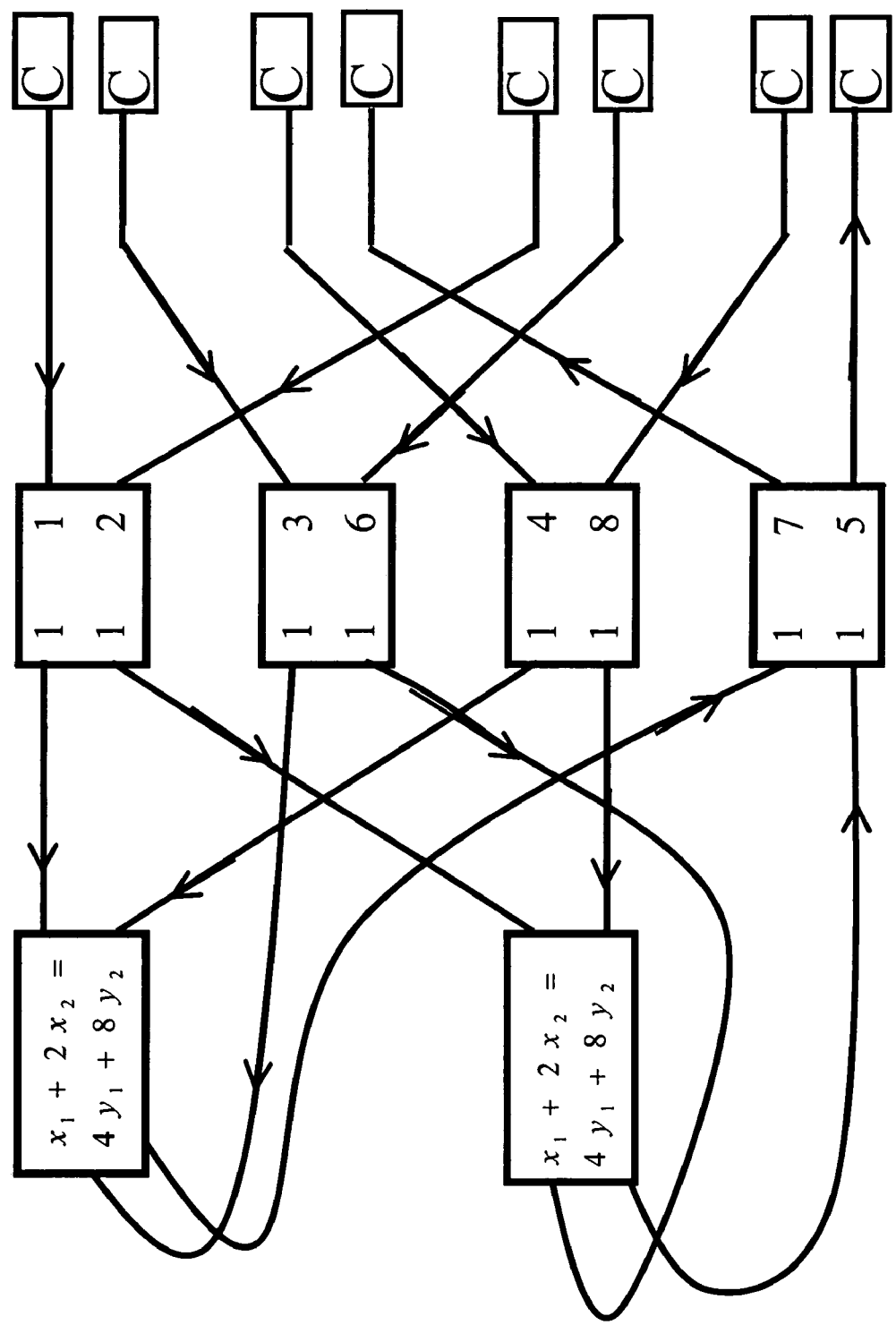
FIG. 33 is an arrow diagram for a non-standard encoder of an $[N=8,k=6,d=5]_{q=9}$ Reed-Solomon code.

In FIG. 33, I show an example of a non-standard encoder for the $[N=8, k=6, d=5]_{q=9}$ Reed-Solomon code.

The encoding method 1022 is "consistent" with the FSTFG representation 1011 of the code 1001 when an arrow diagram can be constructed for the encoding method by adding arrows to the FSTFG.

Selecting a Decoding Method for the FSTFG Code

After the FSTFG code 1022 has been defined and selected, and the representation 1011 has been constructed 101, I select 1030 a decoding method 1032. FSTFG representations of codes are well-suited to message-passing decoding methods 1031, so in the preferred embodiment of the invention, I use a message-passing decoding method.

There are many small variations among message-passing decoding methods for LDPC codes. They differ in a variety of details, including how the message-updates are determined, how the updates are scheduled, and how the decoding method terminates.

In the selected message-passing decoding method 1032 of the preferred embodiment, I make some specific choices for those details. These choices give an excellent decoder of FSTFG codes, but message-passing decoders that vary somewhat in the details of the decoding method are also expected to yield good decoders for FSTFG codes.

Message-update rules 1033 that I use in the preferred embodiment of the invention are partially motivated by the fact that when they are used, together with the belief-update rules 1034 described later, in a decoding method on a FSTFG representation that contains no cycles, the rules are guaranteed to correctly return the code word with the lowest cost.

Message-Update Rules

An important defining characteristic of a message-update decoding method is the message-update rules are utilized. Recall that "messages" are sent from one factor node to another factor node, along the connections between the factor nodes, and that a connection between factor nodes represents a variable. Messages are sent in both directions along each connection.

Each message is a vector of q numbers, corresponding to the q possible states of the variable. The numbers are real-valued, and can also be infinite. The message represents the cost of the q possible states of the variable, given what the factor node that is sending the message knows from the other messages that the node is receiving.

If a factor node is connected to P variables, then there are P messages entering the factor node, and also P messages exiting the factor node. I denote a message that a factor node F sends to a variable x by $m_F(x)$, and when I write its value explicitly, I do so by listing the q numbers that make up a message. When I describe a message that enters a factor node F from a variable x, I denote it by $n_F(x)$. The message $n_F(x)$ entering a factor node F equals the message $m_G(x)$ sent by the factor node G, if the nodes F and G are connected to each other in a normal factor graph.

Every message in a normal factor graph is sent by one factor node. If rules are given on how to compute the messages sent by all the different kinds of factor nodes in a factor graph representation, then a complete set of message-update rules are defined.

Combined Constraint Min-Sum Message Update Rules

In the FSTFG representation of the code, there can be four kinds of factor nodes: factor nodes that constrain a single connected variable to equal zero, factor nodes that represent a soft-input, factor nodes that constrain their connected variables to be equal, and input-output factor nodes.

I now give the rules on how to compute the messages sent by these four kinds of factor nodes in the preferred embodiment of the invention, thereby defining a complete set of message-update rules. I call these message-update rules the "combined constraint min-sum message-update rules."

A factor node that constrains a single connected variable to equal zero sends a message that gives zero cost for the case when the variable equals zero, and infinite cost for all other cases. For example, if $q=3$, then such a factor node sends messages of the form $m_F(x)=(0,\infty,\infty)$ to the connected variable node x.

A factor node that represents a soft-input constraint sends a message that corresponds exactly to the soft input constraint. For example, if $q=3$, and the soft-input cost for a particular code word symbol is $c_0$ when the symbol is a 0 and $c_1$ when the symbol is a 1 and $c_2$ when the symbol is a 2, then the soft-input constraint factor node connected to the variable x corresponding to the code word symbol sends a message $m_F(x)=(c_0,c_1,c_2)$ to that variable.

A factor node enforcing equality between j connected variables, sends out messages to each of those variables based on the messages entering the factor node from the other j−1 variables. The messages sent out is the term-wise sums of the messages entering the factor node. For example, if an equality factor node constrains three ternary variables $x_1$, $x_2$ and $x_3$ to be equal, and the messages entering the equality factor node from $x_2$ and $x_3$ are $n_F(x_2)=(0.0,2.5,7.0)$ and $n_F(x_3)=(1.0,\infty,0.0)$, then the message from the equality factor node to $x_1$ is $m_F(x_1)=(1.0,\infty,7.0)$.

The most complicated message-update rules to define are those for the input-input factor nodes. A rank k input-output factor node has 2k entering messages, of which k enter along input variable connections, and k enter along output variable connections. The node also has 2k exiting messages, of which k leave along input variable connections, and k exit along output variable connections. To compute a message $m_F(x)$ sent by an input-output factor node to a particular connecting variable x, I use the 2k−1 messages that enter the input-output factor node from the other connecting variables.

The message $m_F(x)$ sent out to a particular variable x is computed by taking the minimum over the sums of the input messages when their arguments are consistent with each other and with x.

As an example, consider an input-output factor node that enforces the constraints $y_1=x_1+x_2$ and $y_2=x_1+2x_2$, over the four ternary variables $x_1, x_2, y_1,$ and $y_2$. To compute the message $m_F(y_2)$ sent by the factor node to $y_2$, I need the messages $n_F(x_1)$, $n_F(x_2)$, and $n_F(y_1)$. Suppose that these messages are $(f_0,f_1,f_2)$, $(g_0,g_1,g_2)$, and $(h_0,h_1,h_2)$, respectively. To compute the message $m_F(y_2)$ when $y_2$ equals zero, I need to consider the cases when the other variables are in configurations consistent with that. Those cases are $x_1=x_2=y_1=0$; $x_1=x_2=1,y_1=2$; and $x_1=x_2=2,y_1=1$. Therefore, in this example, the message component $m_F(y_2=0)$ is given by $\min(f_0+g_0+h_0, f_1+g_1+h_2, f_2+g_2+h_1)$. The components $m_F(y_2=1)$ and $m_F(y_2=2)$ are computed similarly by taking the minimum over the sums of the other messages when their arguments are consistent with each other and with $y_2$.

Message-update rules for factor nodes that are obtained by simplifying input-output factor nodes are directly obtained by making the corresponding simplifications on the message-update rules for the input-output factor node.

The Belief-Update Rules

Another defining characteristic of a message-passing decoding method is its "belief-update rules." A variable in a normal factor graph is connected to one or two factor nodes. At any point in my message-passing decoding method, I can use a set of rules to approximately compute the cost of each variable based on incoming messages. These rules are called the "belief-update rules."

In the preferred embodiment of the invention for my belief-update rules, the cost of a variable to be in each of its q states is the term-wise sum of the incoming messages to that variable. For example, suppose that a ternary variable is sent the two messages $(f_0,f_1,f_2)$ and $(g_0,g_1,g_2)$. Then, the cost of that variable to be in its three states is $(f_0+g_0, f_1+g_1, f_2+g_2)$ according to my belief-update rules.

Outline of the Decoding Method

Having selected an FSTFG code, a possibly simplified or redundant representation of that code, an encoding method, and the message-update and belief-update rules, I am now ready to use the message-passing decoding method, which accepts soft-input cost functions, and outputs low-cost code words.

The decoder 1032 is first initialized 1040, and then the decoder cycles until termination to output a low-cost code word.

Throughout the decoding cycle, the decoder maintain a list of messages. There are two messages for every variable in the FSTFG representation. The decoder also maintains a tentative output, which is a code word of the FSTFG code, and the associated cost.

Initializing the Decoder

Recall that a soft-input cost function 1123 is a q by N matrix of numbers, which are real numbers or infinite. The soft-input cost function 1123 that is received is first used to initialize 1040 the messages 1041 from the soft-input constraint factor nodes to the variables connected to the nodes in the FSTFG representation 1011. The messages 1041 are initialized 1040 to correspond to the columns of the soft-input cost function matrix.

For example, if FSTFG code had N=4 ternary code word symbols, and that the soft-input cost function is $$C = \begin{pmatrix} 0.1 & 0.2 & 0.1 & 0.1 \\ 1.0 & 0.0 & 2.5 & 1.5 \\ 0.0 & 2.0 & 0.0 & 0.0 \end{pmatrix}, \quad (25)$$

then, there are four variables in the FSTFG representation corresponding to the code word symbols, which are denoted by $x_1, x_2, x_3$, and $x_4$. Connected to each such variable is a soft-input constraint factor node, which is denoted by $C_1$, $C_2$, $C_3$ and $C_4$, respectively. The initial values of the messages $m_{c_1}(x_1) m_{c_2}(x_2) m_{c_3}(x_3)$, and $m_{c_4}(x_4)$ are $(0.1,1.0,0.0)$, $(0.2,0.0,2.0)$, $(0.1,2.5,0.0)$, and $(0.1,1.5,0.0)$, respectively.

The initial value of every other message in the decoder is initialized to be all zeros.

Initially, no tentative code word is selected, and the cost of the tentative code word is set to infinity. This means that the first trial code word selected later that has finite cost becomes the tentative code word.

Updating the Messages

As shown in FIG. 11 for the first step of the decoding cycle, all the messages 1111 are updated 1110. Each message is updated according to the message-update rules 1033 for the kind of factor node that sends that message.

In the preferred embodiment of the invention, the following message-update schedule is used. The old value for every message is stored. Then, a set of new messages for the entire factor graph 1011 is determined, using the old messages. Then, the old messages are replaced with the new messages. This schedule has the virtue of simplicity, but other ways to schedule messages are possible and work as well.

For example, one can update a single message at a time, and immediately replace its old value with the new value, before computing the updated value of the next message. Another reasonable possibility is to update a layered set of messages, before moving on to another layer.

It may also be useful to compute new values of the messages, and then to replace each message with a weighted average of its old value and its new computed value.

Determining a Trial Code Word

After updating the messages, determine 1120 a trial code word 1121 and its associated cost 1122. To determine the trial code word, I first obtain a set of states for k variables in the FSTFG representation that correspond to information symbols. These k variables are readily identifiable from the encoding method that was selected.

The states of the k variables are obtained by using the belief-update rules 1034, and selecting the state for each variable that has the lowest costs. If two or more states for a variable have the same cost, a tie-breaking procedure is employed, e.g., a random selection.

Given the states of the k variables corresponding to information symbols, then use the selected encoder 1022 to compute the trial code word. The cost of the trial code word can then be computed using a soft-input cost function 1123.

Updating the Code Word

In the third step 1130 of the decoding cycle, I compare the cost 1122 of the trial code word 1121 with that of our current tentative code word 1131. If the cost is less, then I replace the tentative code word 1131 with the trial code word 1121. Thus, at each stage of the decoding method, our tentative code is the trial code word so far encountered that has the lowest cost.

Termination

In the fourth step 1140 of the decoding cycle, a termination condition is checked. In the preferred embodiment of the invention, the termination condition is that a fixed number of decoding cycles are performed.

If the termination condition is satisfied, the code word outputs 1150 the current tentative code word 1131. If there is still no tentative code word, because no trial code word of finite cost has been encountered, then the decoder outputs a failure state. If the termination condition is not satisfied, then the decoder repeats beginning with the first step 1110 of the decoding cycle.

Combining or Concatenating the Decoder with other Decoders

The decoder according to my invention can be combined with other decoders, in order to obtain a more powerful combined decoder. For example, for Reed-Solomon codes, the decoder can be combined with a Koetter-Vardy soft-input decoder. Both decoders output a code word, and the lower cost code word is selected as the output of the combined decoder.

I can use also this strategy, in combination with a hard-input bounded-distance decoder that uses thresholding, to ensure that my combined decoder does not have an error-floor at large signal-to-noise ratios. Thus, I can combine the advantages of a message-passing decoding method, which performs well empirically at low signal-to-noise ratios, with the advantages of a bounded-distance decoder, which is guaranteed to perform well at high signal-to-noise ratios.

The decoder according to my invention can also be concatenated with other soft-input decoders. When this strategy is used, the beliefs computed with the decoder according to my invention are used as an improved soft-input cost function for another soft-input decoder.

When the concatenation strategy is used, I prefer that the beliefs are computed at every input into the second soft-input decoder at every stage of the decoding cycle. The initial beliefs will equal the original soft-input cost function, and the updated beliefs provide a soft-input cost function that more correctly reflects the soft-input costs.

Effect of the Invention

The described decoder is capable of correctly decoding many soft-input cost functions that are not correctly decoded by prior art methods.

Prior art decoding methods fail when thresholding the soft-input cost function gives a word that is very far from the correct code word. My decoding method can succeed in such cases.

As a simple example, consider the $[N=4, k=2, d=3]_{q=4}$ extended Reed-Solomon code that has generator matrix $$G = \begin{pmatrix} 1 & 1 & 1 & 1 \\ 0 & 1 & 2 & 3 \end{pmatrix}.$$

Figure 34:
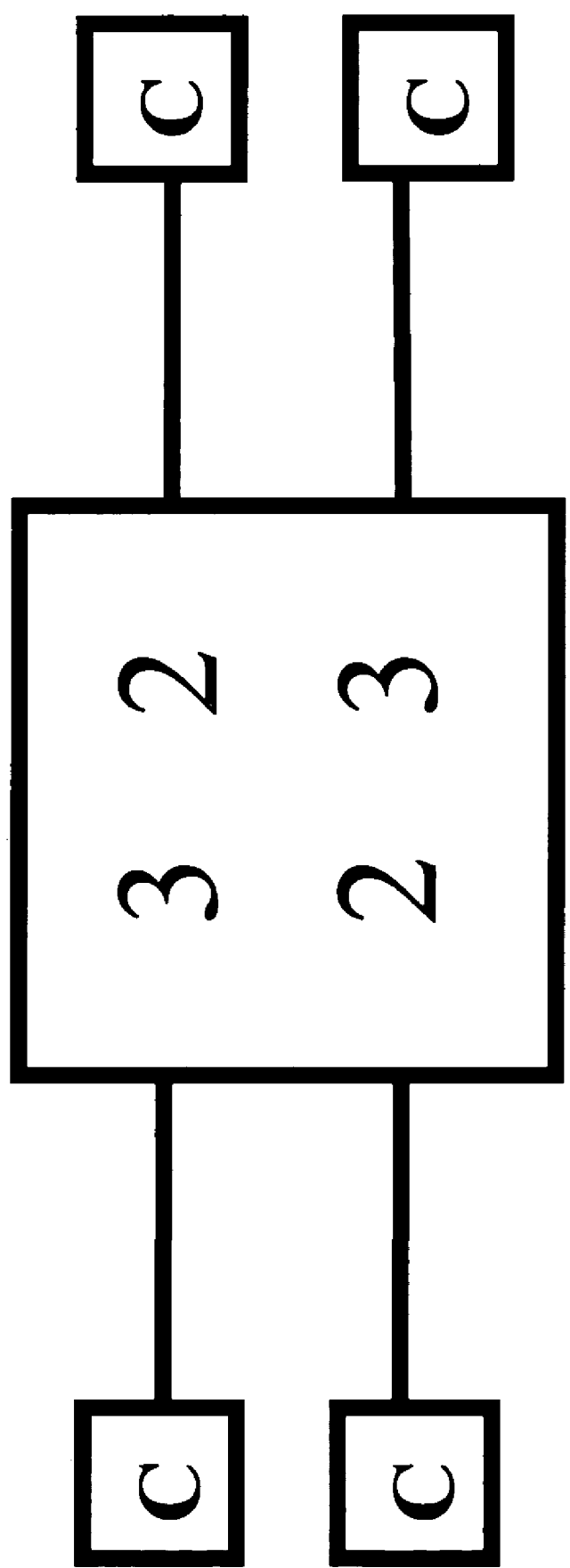
FIG. 34 is an FSTFG representation of an $[N=4,k=2, d=3]_{q=4}$ extended Reed-Solomon code.

This code has a simplified FSTFG representation shown in FIG. 34.

Suppose the following soft-input cost function is received $$\begin{pmatrix} 5 & 5 & 5 & 5 \\ 0 & \infty & 0 & \infty \\ \infty & 0 & \infty & 0 \\ \infty & \infty & \infty & \infty \end{pmatrix}.$$

The only code word of this code that has a finite cost for this soft-input cost function is the code word 0000. On the other hand, thresholding this soft-input cost function gives the code word 1212, which is different from the code word in every one of the code word symbols. Such a word is too far from the correct code word for a bounded distance decoder, which in this case only succeeds when the thresholded word differs from the code word in one symbol or less.

A Koetter-Vardy decoder would also fail on this example. On the other hand, my decoder decodes successfully, because it actually decodes a single input-output factor node exactly.

Of course, this is a very small example that uses a decoder with only a single input-output factor node. However, larger decoders constructed out of many input-output factor nodes inherit the advantages of processing each input-output factor node exactly.

Finally, the decoding method according to the invention is ideally suited for VLSI hardware implementation, because each input-output factor node can be implemented as a small module, and number of connections between the modules is limited.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

I claim:

1. A method for decoding an $[N, k]_q$ sparse transform factor graph code using a soft-input cost function, where k is a dimension of the code, N is a number of symbols to be decoded, q is a number of elements in an alphabet for the symbols of the code, and a number of input elements of the sparse factor graph is M, comprising:
    a one-time initialization procedure; comprising:
        constructing a sparse transform factor graph representation of the code;
        selecting an encoding method consistent with the representation;
        selecting a message-passing decoder method consistent with the representation;
        initializing messages of the selected decoder method according to the soft-input cost function; and
    an iterative decoding procedure, comprising:
        updating messages according to message-update rules of the selected decoder; and
        outputting a code word when a termination condition is true, and otherwise repeating the iteration of the decoding procedure.

2. The method of claim 1, in which the code is a Reed-Solomon code.

3. The method of claim 1, in which the code is an extended Reed-Solomon code.

4. The method of claim 1, in which the code is a punctured Reed-Solomon code.

5. The method of claim 1, in which the code is a extended ternary Golay code.

6. The method of claim 1, in which the code is a non-binary code.

7. The method of claim 1, in which the sparse transform factor graph includes input-output factor nodes, each input-output factor node has k input variables entering the node from the left, and k output variables exiting the node from the right, and the input variables and the output variables are related by 2k constraints, where k is a rank of the input-output factor node.

8. The method of claim 7, in which the rank k is two.

9. The method of claim 7, further comprising: stacking and layering the input-output factor nodes.

10. The method of claim 1, wherein the sparse transform factor graph code is a fast sparse transform factor graph code.

11. The method of claim 10, in which the fast sparse transform factor graph has M q-ary input and output variables, and where N input, internal, and output transform variables in the fast sparse transform factor graph are connected to soft-constraint factor nodes, and M−k of the input variables are connected to factor nodes that constrain the input variables to equal zero.

12. The method of claim 11, in which the fast sparse transform factor graph includes hard-constraint equality constraint factor nodes to copy the internal transform variables that are connected to the soft-constraint factor nodes.

13. The method of claim 1, further comprising:
simplifying the sparse transform factor graph representation.

14. The method of claim 13, further comprising:
generating a plurality of the simplified sparse transform factor graph representations; and
combining the plurality of the simplified sparse transform factor graph representations into a redundant sparse transform factor graph representation.

15. The method of claim 1, in which the message passing decoding method includes message-update rules and belief-update rules.

16. The method of claim 1, in which the messages are initialized to zero.

17. The method of claim 1, in which the iterative decoding procedure further comprises:
determining a trial code word from the messages, the selected decoder method and the encoding method;
determining a cost of the trial code word using the soft-input cost function;
updating a tentative code word with the trial code word if the trial code word has lower cost than the tentative code word; and
terminating by outputting the tentative code word when the termination condition is true, and otherwise repeating the iteration of the decoding procedure.

18. The method of claim 17, in which an initial cost of the tentative code word is infinity.

19. The method of claim 17, in which the termination condition is fixed number of iterations.

20. The method of claim 1, further comprising:
combining the selected decoder with a with a different decoder.

21. The method of claim 1, further comprising:
combining the selected decoder with a hard-input bounded-distance decoder that uses thresholding.

22. The method of claim 1, further comprising:
concatenating the selected decoder with a different soft-input decoder.

* * * * *